US012700336B2

(12) United States Patent
Park et al.

(10) Patent No.: US 12,700,336 B2
(45) Date of Patent: Aug. 4, 2026

(54) DISPLAY DEVICE

(71) Applicant: LG Display Co., Ltd., Seoul (KR)

(72) Inventors: JaeHee Park, Paju-si (KR); JongSung Kim, Paju-si (KR); Hoiyong Kwon, Paju-si (KR); Sunghee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/966,004

(22) Filed: Dec. 2, 2024

(65) Prior Publication Data

US 2025/0279020 A1 Sep. 4, 2025

(30) Foreign Application Priority Data

Feb. 29, 2024 (KR) ........................ 10-2024-0029984

(51) Int. Cl.
G09G 3/00 (2006.01)
G09G 3/3233 (2016.01)
(Continued)

(52) U.S. Cl.
CPC ........... G09G 3/006 (2013.01); G09G 3/3233 (2013.01); H10K 59/131 (2023.02); H10K 59/80515 (2023.02); G09G 2300/0426 (2013.01); G09G 2300/0819 (2013.01); G09G 2300/0842 (2013.01); G09G 2310/08 (2013.01); G09G 2320/0233 (2013.01); G09G 2330/12 (2013.01)

(58) Field of Classification Search
CPC ................. G09G 3/006; G09G 3/3233; G09G 2300/02426; G09G 2300/0819; G09G 2300/0842; G09G 2310/08; G09G 2320/0233; G09G 2330/12; G09G 2330/08; G09G 2330/10; H10K 59/131; H10K 71/861; H10K 71/70; H10K 59/123; H10K 59/1213; H10K 59/8051; H10K 59/80527

See application file for complete search history.

(56) References Cited

U.S. PATENT DOCUMENTS

2004/0222746 A1* 11/2004 Winters ............... G09G 3/3233
315/169.3
2014/0354704 A1* 12/2014 Pak ...................... G09G 3/2077
345/82

(Continued)

FOREIGN PATENT DOCUMENTS

KR 10-2282170 B1 7/2021

*Primary Examiner* — David Tung
(74) *Attorney, Agent, or Firm* — Fenwick & West LLP

(57) ABSTRACT

Disclosed is a display device comprising a driving transistor provided on a substrate and including a gate electrode, a source electrode, and a drain electrode, a light emitting element provided on the driving transistor and including an anode electrode having a first anode electrode and a second anode electrode spaced apart from each other, an emission layer, and a cathode electrode, a first anode connection portion configured to electrically connect the first anode electrode and the driving transistor to each other, and a second anode connection portion configured to electrically connect the second anode electrode and the driving transistor to each other, wherein the first anode connection portion includes a control transistor having an active layer, a gate electrode, a source electrode, and a drain electrode.

22 Claims, 15 Drawing Sheets

(51) Int. Cl.
    *H10K 59/131*     (2023.01)
    *H10K 59/80*     (2023.01)

(56)            References Cited

U.S. PATENT DOCUMENTS

| | | | |
|---|---|---|---|
| 2015/0145906 A1* | 5/2015 | Uetake | G09G 3/207 |
| | | | 345/694 |
| 2021/0125555 A1* | 4/2021 | Yamamoto | G09G 3/3233 |
| 2022/0149128 A1* | 5/2022 | Shim | H10K 59/124 |
| 2022/0208916 A1* | 6/2022 | Kim | H10K 59/123 |
| 2023/0100284 A1* | 3/2023 | Yao | G09G 3/32 |
| | | | 345/55 |

* cited by examiner

DISPLAY DEVICE

CROSS-REFERENCE TO RELATED APPLICATION

This application claims the benefit of the Republic of Korea Patent Application No. 10-2024-0029984 filed on Feb. 29, 2024, which is hereby incorporated by reference as if fully set forth herein.

BACKGROUND

Technical Field

The present disclosure relates to a display device.

Description of the Related Art

A display device includes a first electrode, an emission layer, and a second electrode sequentially stacked. When a voltage is applied to the first electrode and the second electrode, light may be emitted from the emission layer.

The description provided in the background section should not be assumed to be prior art merely because it is mentioned in or associated with the background section. The background section may include information that describes one or more aspects of the subject technology.

SUMMARY

It is newly recognized that, in the display device, foreign substances may be generated on the first electrode during a manufacturing process. In this case, a short may occur between the first electrode and the second electrode in the area where the foreign substances are generated. Accordingly, the display device has a problem in that an entire subpixel in which foreign substances are generated becomes darkened and cannot emit light. Accordingly, a luminance degradation may occur in the display device.

Therefore, the inventors of the present disclosure recognized the limitations mentioned above and other limitations associated with the related art, and conducted various experiments to implement a display device capable of reducing an extent of a darkened emission area.

Another aspect of the present disclosure is to provide a display device capable of accurately darkening only the area where foreign substances are generated.

Yet another aspect of the present disclosure is to provide a display device capable of implementing ESG (Environment/Social/Governance) by reducing a generation of greenhouse gas which may occur due to a manufacturing process.

To achieve these and other aspects of the inventive concepts, as embodied and broadly described herein, a display device may comprise a driving transistor provided on a substrate and including a gate electrode, a source electrode, and a drain electrode, a light emitting element provided on the driving transistor and including an anode electrode having a first anode electrode and a second anode electrode spaced apart from each other, an emission layer, and a cathode electrode, a first anode connection portion configured to electrically connect the first anode electrode and the driving transistor to each other, and a second anode connection portion configured to electrically connect the second anode electrode and the driving transistor to each other, wherein the first anode connection portion includes a control transistor having an active layer, a gate electrode, a source electrode, and a drain electrode.

In accordance with another aspect of the present disclosure, there is provided a display device comprising a substrate provided with a plurality of transmission area and a plurality of subpixels disposed between the plurality of transmission areas, a driving transistor provided on the substrate and including a gate electrode, a source electrode, and a drain electrode, an anode electrode provided in each of the plurality of subpixels and including a first anode electrode and a second anode electrode, a control transistor configured to control a connection between the first anode electrode and the driving transistor, and an anode connection line configured to electrically connect the second anode electrode to the driving transistor.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that may be included to provide a further understanding of the disclosure and may be incorporated in and constitute a part of the disclosure, illustrate embodiments of the disclosure and together with the description serve to explain various principles of the disclosure.

The above and other aspects, features and other advantages of the present disclosure will be more clearly understood from the following detailed description taken in conjunction with the accompanying drawings, in which.

Figure 1:
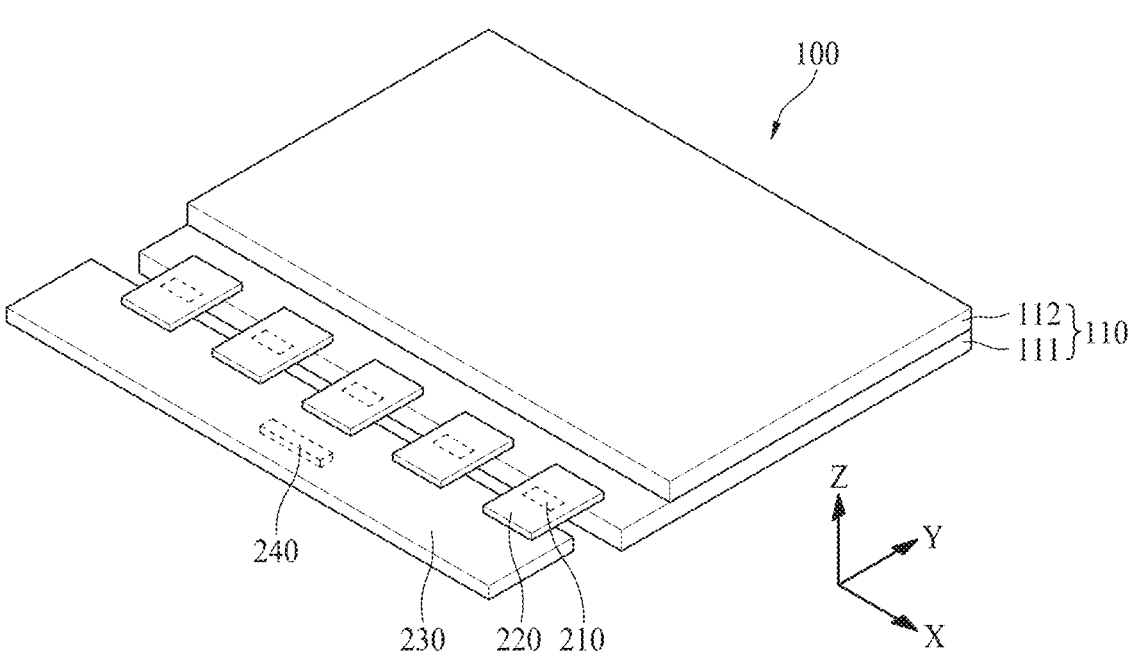
FIG. 1 is a perspective view schematically illustrating a display device according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure, and implementation methods thereof will be clarified through the following example embodiments, described with reference to the accompanying drawings. The present disclosure may, however, be embodied in different forms and should not be construed as being limited to the example embodiments set forth herein. Rather, these example embodiments are provided so that this disclosure will be thorough and complete, and will fully convey the scope of the present disclosure to those skilled in the art.

The shapes, sizes, areas, ratios, angles, and numbers disclosed in the drawings for describing example embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or briefly provided. In the case in which "comprise," "have," "include", and "consist of" described in the present specification are used, another part may also be present unless "only" is used. The terms in a singular form may include plural forms unless noted to the contrary. Any implementation described herein as an "example" is not necessarily to be construed as preferred or advantageous over other implementations.

In construing an element, the element is construed as including an error range or tolerance range although there is no explicit description thereof.

In describing a positional relationship, for example, when the positional order is described using "on," "over," "under," "above," "below," "beneath," "near," "close to," or "adjacent to," "beside," "next to," or the like, one or more other parts may be disposed between the two parts unless a more limiting term, such as "immediate(ly)," "direct(ly)," or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which a third structure is disposed or interposed therebetween. Furthermore, the terms "left," "right," "top," "bottom," "downward," "upward," "upper," "lower," and the like refer to an arbitrary frame of reference.

In describing a temporal relationship, for example, when the temporal order is described as "after," "subsequent," "next," and "before," a case which is not continuous may be included, unless a more limiting term, such as "just", "immediate" or "direct" is used.

It will be understood that, although the terms "first," "second," "A," "B," "(a)," "(b)" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Also, when an element or layer is described as being "connected," "coupled," or "adhered" to another element or layer, the element or layer can not only be directly connected, or adhered to that other element or layer, but also be indirectly connected, or adhered to that other another element or layer with one or more intervening elements or layers "disposed" between the elements or layers, unless otherwise specified.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

A transistor used in a display device according to exemplary embodiments of the present disclosure may be implemented as any one transistor of an n-channel transistor (NMOS) and a p-channel transistor (PMOS). The transistor may be implemented as an oxide semiconductor transistor having an oxide semiconductor as an active layer or a low temperature poly-silicon (LTPS) transistor having LTPS as the active layer. The transistor may at least include a gate electrode, a source electrode, and a drain electrode. The transistor may be implemented as a thin film transistor (TFT) on a display panel. A carrier in the transistor flows from a source electrode to a drain electrode. In the case of the n-channel transistor (NMOS), since the carrier is an electron, a source voltage may be lower than a drain voltage so that the electron may flow from the source electrode to the drain electrode. In the n-channel transistor (NMOS), a current may flow from the drain electrode to the source electrode, and the source electrode may be an output terminal. In the case of the p-channel transistor (PMOS), since the carrier is a hole, the source voltage may be higher than the drain voltage so that the hole may flow from the source electrode to the drain electrode. Since the hole flows from the source electrode to the drain electrode in the p-channel transistor (PMOS), the current may flow from a source electrode to a drain electrode, and the drain electrode may be the output terminal. Accordingly, it should be noted that since the source and the drain may be changed according to an applied voltage, the source and the drain of the transistor are not fixed. In the present disclosure, a description is made by assuming that the transistor is the n-channel transistor (NMOS), but the present disclosure is not limited thereto, but the p-channel transistor may be used, and as a result, a circuit configuration may also be changed.

Hereinafter, various example embodiments of display device according to the present disclosure will be described in detail with reference to the accompanying drawings. In the drawings, the same or similar elements are denoted by the same reference numerals even though they are depicted in different drawings. Also, in the following description, when the detailed description of the relevant known technology is determined to unnecessarily obscure the important point of the present disclosure, the detailed description will be omitted.

Hereinafter, various example embodiments of the present disclosure will be described in detail with reference to the accompanying drawings.

Figure 2:
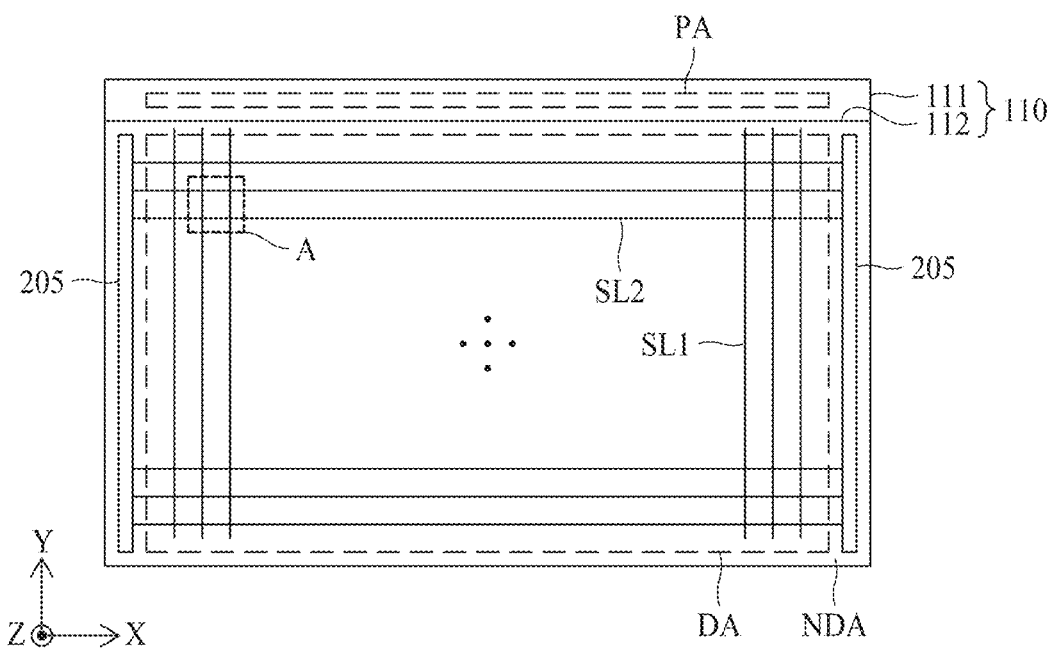
FIG. 2 is a plan view schematically illustrating a display panel according to an example embodiment of the present disclosure.

FIG. 1 is a perspective view schematically illustrating a display device according to an embodiment of the present disclosure, and FIG. 2 is a plan view schematically illustrating a display panel according to an embodiment of the present disclosure.

Hereinafter, an X-axis represents a direction parallel to a scan line, a Y-axis represents a direction parallel to a data line, and a Z-axis represents a height direction of a display device 100.

Although the display device 100 according to an embodiment of the present disclosure has been described as an organic light emitting display device, the present disclosure is not limited thereto, and the display device of the present application may be implemented as a liquid crystal display device, a quantum dot light emitting display device, a micro-LED display device, or an electrophoresis display device.

Referring to FIGS. 1 and 2, the display device 100 according to an embodiment of the present disclosure includes a display panel 110, a source drive integrated circuit (hereinafter, referred to as "IC") 210, a flexible film 220, a circuit board 230, and a timing controller 240.

The display panel 110 includes a first substrate 111 and a second substrate 112 confronting each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be formed of a transparent material. For example, the first substrate 111 or the second substrate 112 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

The display panel 110 may be divided into a display area DA in which pixels are formed to display an image and a non-display area NDA which is adjacent to the display area DA and does not display an image.

The display area DA may be provided with first signal lines SL1, second signal lines SL2, and pixels, and the non-display area NDA may be provided with a pad area PA in which pads are disposed and at least one scan driver 205.

The first signal lines SL1 may extend in the second direction (e.g., Y-axis direction) and may intersect the second signal lines SL2 in the display area DA. The second signal lines SL2 may extend in the first direction (e.g., X-axis direction) in the display area DA. The pixels are provided in a region where the first signal line SL1 is provided or a region where the first signal line SL1 and the second signal line SL2 intersect each other and emit predetermined light to display an image. The first signal line SL1 may include gate lines, and the second signal line SL2 may include signal lines DL, VDDL, VSSL, and REFL to be describer below.

The plurality of pads may be disposed in the pad area PA. Since the size of the first substrate 111 is larger than the size of the second substrate 112, a portion of the first substrate 111 may be exposed without being covered by the second substrate 112. The pads such as power pads and data pads may be provided on the portion of the first substrate 111 exposed without being covered by the second substrate 112.

The scan driver 205 is connected to the scan line and is configured to supply scan signals thereto. The scan driver 205 may be formed as a gate driver in panel GIP manner in the non-display area NDA on one side or both sides of the display area DA of the display panel 110. Alternatively, the scan driver 205 may be manufactured as a driving chip and may be mounted on the flexible film and may be attached to the non-display area NDA on one side or both sides of the display area DA of the display panel 110 in a tape automated bonding TAB manner.

The source drive IC 210 receives digital video data and a data control signal from the timing controller 240. The source drive IC 210 converts the digital video data into analog data voltages according to the data control signal and supplies the analog data voltages to the data lines. When the source drive IC 210 is manufactured as a driving chip, the source drive IC 210 may be mounted on the flexible film 220 in a chip on film COF or chip on plastic COP method.

Wirings for connecting the pads to the source drive IC 210 and wirings for connecting the pads to wirings of the circuit board 230 may be formed on the flexible film 220. The flexible film 220 may be attached onto the pads using an anisotropic conducting film, whereby the pads and the wirings of the flexible film 220 may be connected to each other.

The circuit board 230 may be attached to the flexible films 220. A plurality of circuits implemented as driving chips may be mounted on the circuit board 230. For example, the timing controller 240 may be mounted on the circuit board 230. The circuit board 230 may be a printed circuit board or a flexible printed circuit board.

The timing controller 240 receives digital video data and a timing signal from an external system board (not shown). The timing controller 240 generates a scan control signal for controlling an operation timing of the scan driver and the data control signal for controlling the source drive ICs 210 based on the timing signal. The timing controller 240 supplies the scan control signal to the scan driver 205 and supplies the data control signal to the source drive ICs 210.

Figure 3:
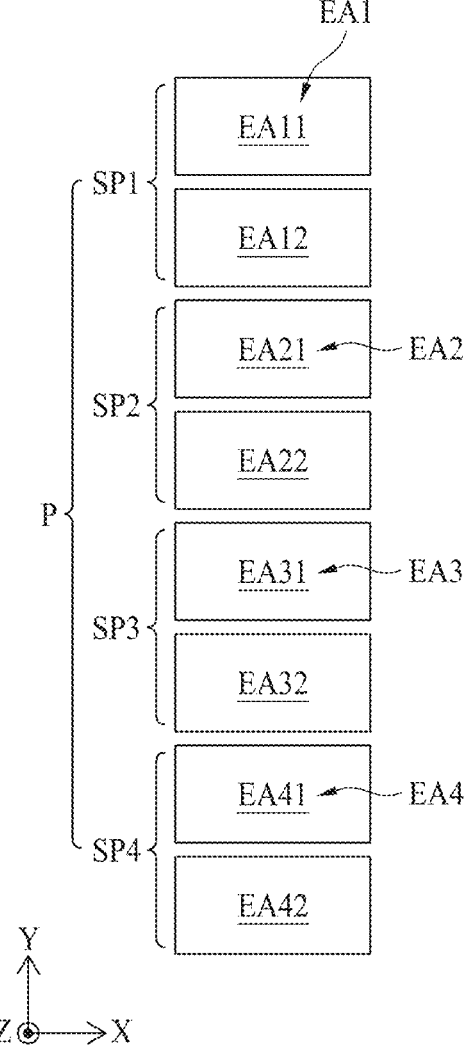
FIG. 3 schematically illustrates an example embodiment of a pixel provided in a region A of FIG. 2.
Figure 4:
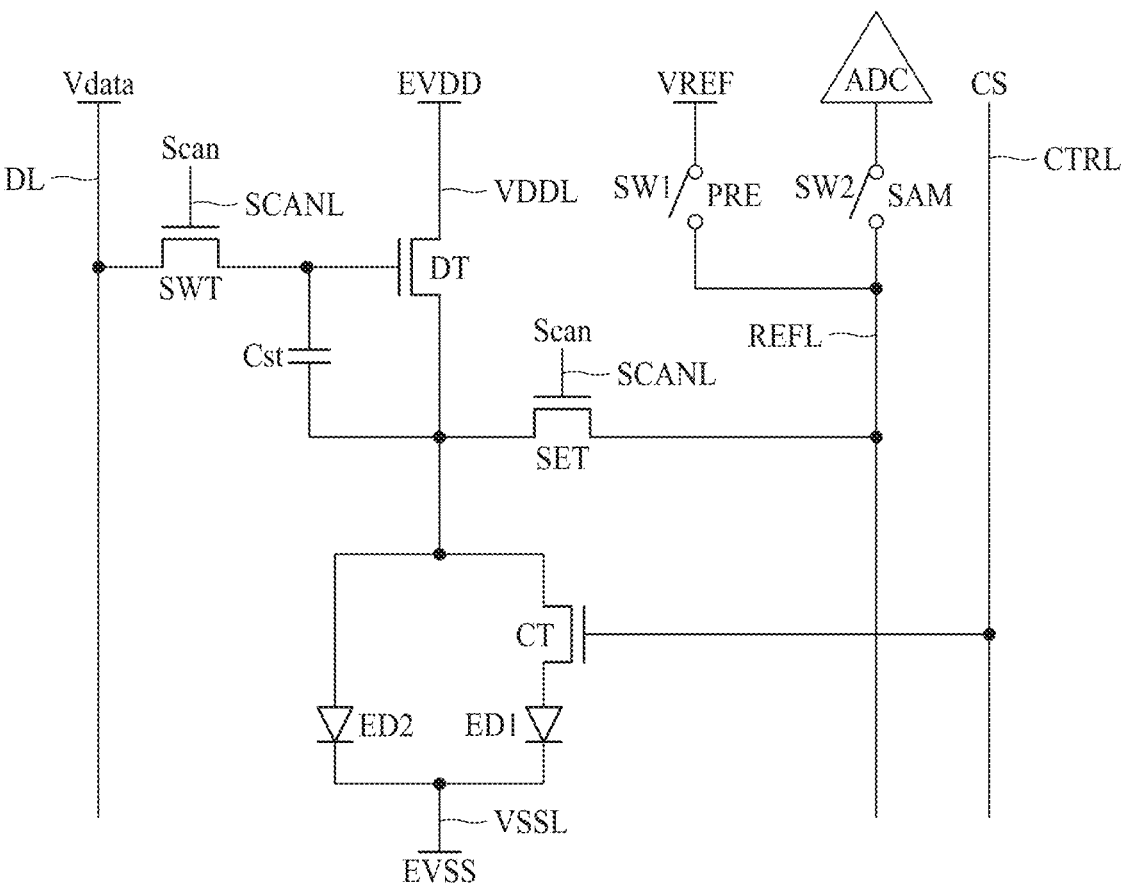
FIG. 4 is a circuit diagram illustrating an example of a circuit element of a subpixel shown in FIG. 3.

FIG. 3 schematically illustrates an embodiment of a pixel provided in a region A of FIG. 2, and FIG. 4 is a circuit diagram illustrating an example of a circuit element of a subpixel shown in FIG. 3.

The display panel 110 according to an embodiment of the present disclosure may include a display area DA in which pixels P are formed to display an image, and a non-display area NDA (See FIG. 2) in which an image is not displayed.

Each of the pixels P includes a plurality of subpixels SP1, SP2, SP3, and SP4. The plurality of subpixels SP1, SP2, SP3, and SP4 may be arranged in a matrix form to emit predetermined light to display an image. The plurality of subpixels SP1, SP2, SP3, and SP4 may include a plurality of row lines including subpixels SP1, SP2, SP3, and SP4 arranged in the first direction (e.g., X-axis direction) and a plurality of column lines including subpixels SP1, SP2, SP3, and SP4 arranged in the second direction (e.g., Y-axis direction).

Each pixel P may include at least two subpixels. For example, each pixel P may include a first subpixel SP1, a second subpixel SP2, and a third subpixel SP3, but not limited thereto. Each pixel P may further include a fourth subpixel SP4.

The first subpixel SP1 includes a first emission area EA1 for emitting first color light, and the second subpixel SP2 may include a second emission area EA2 for emitting second color light. The third subpixel SP3 includes a third emission area EA3 for emitting third color light, and the fourth subpixel SP4 may include a fourth emission area EA4 for emitting fourth color light.

The first to fourth emission areas EA1, EA2, EA3, and EA4 may emit light of different colors. For example, the first emission area EA1 may emit red light, the second emission area EA2 may emit green light, the third emission area EA3 may emit blue light, and the fourth emission area EA4 may emit white light, but not limited thereto. Also, the emitted color, arrangement order of the plurality of subpixels SP1, SP2, SP3, and SP4 may be variously changed.

In addition, the emission areas EA1, EA2, EA3, and EA4 included in the plurality of subpixels SP1, SP2, SP3, and SP4 may include a plurality of sub-emission areas. In detail, the first emission area EA1 included in the first subpixel SP1 may include a first sub-emission area EA11 and a second sub-emission area EA12 divided into the two. The second emission area EA2 included in the second subpixel SP2 may include a first sub-emission area EA21 and a second sub-emission area EA22 divided into the two. The third emission area EA3 included in the third subpixel SP3 may include a first sub-emission area EA31 and a second sub-emission area EA32 divided into the two. The fourth emission area EA4 included in the fourth subpixel SP4 may include a first sub-emission area EA41 and a second sub-emission area EA42 divided into the two. However, the present disclosure is not limited thereto, and each emission area may be divided into three or more sub-emission areas.

Hereinafter, for convenience of explanation, each of the emission areas EA1, EA2, EA3, and EA4 of the plurality of subpixels SP1, SP2, SP3, and SP4 includes two sub-emission areas, but not limited thereto. Each of the emission areas EA1, EA2, EA3, and EA4 of the plurality of subpixels SP1, SP2, SP3, and SP4 may include the two or more sub-emission areas.

Each of the plurality of subpixels SP1, SP2, SP3, and SP4 may include a light emitting element for emitting light and a circuit element. In detail, as shown in FIG. 4, each of the plurality of subpixels SP1, SP2, SP3, and SP4 may include a circuit element having a 4T (Transistor) 1C (Capacitor) structure including a switching transistor SWT, a sensing transistor SET, a driving transistor DT, a capacitor Cst, and a control transistor CT, and first and second light emitting elements ED1 and ED2, but not limited thereto. Each of the subpixels SP1, SP2, SP3, and SP4 may further include a compensation circuit. In this case, various structures such as 4T2C, 5T2C, 6T1C, 6T2C, 7T1C, 7T2C, and the like may be provided, and more or less transistors and capacitors could be included.

Each of the transistors DT, SWT, SET, and CT in each of the subpixels SP1, SP2, SP3, and SP4 may include a gate electrode, a source electrode, and a drain electrode. Since the source electrode and the drain electrode are not fixed and may be changed according to a voltage and a current direction applied to the gate electrode, any one of the source electrode and the drain electrode may be referred to as a first electrode, and the other may be represented as a second electrode. The transistors DT, SWT, SET, and CT in each of the subpixels SP1, SP2, SP3, and SP4 may use at least one of polysilicon semiconductor, amorphous silicon semiconductor, and oxide semiconductor. The transistors DT, SWT, SET, and CT may be P-type or N-type transistors, or P-type and N-type transistors may be used interchangeably.

The switching transistor SWT may charge the capacitor Cst with a data voltage Vdata supplied from a data line DL. The gate electrode of the switching transistor SWT may be connected to a scan line SCANL, and the first electrode of the switching transistor SWT may be connected to the data line DL. In addition, the second electrode of the switching transistor SWT may be connected to one end of the capacitor Cst, for example, the gate electrode of the driving transistor DT.

The switching transistor SWT may be turned-on in response to a scan signal Scan applied through the scan line SCANL. When the switching transistor SWT is turned-on, the data voltage Vdata applied through the data line DL may be transferred to one end of the capacitor Cst.

The sensing transistor SET may supply a reference voltage Vref supplied from a reference line REFL to the driving transistor DT. In detail, the gate electrode of the sensing transistor SET may be connected to the scan line SCANL, and the first electrode of the sensing transistor SET may be connected to the reference line REFL. In addition, the second electrode of the sensing transistor SET may be connected to the second electrode of the driving transistor DT and the other end of the capacitor Cst.

In addition, the reference line REFL may be connected to a reference voltage source VREF or an analog-to-digital AD converter ADC according to a control signal. A first switch SW1 may connect or disconnect the reference voltage source VREF to or from the reference line REFL according to an initialization control signal PRE. When the first switch SW1 is turned-on according to the initialization control signal PRE of turn-on level, the reference line REFL may be connected to the reference voltage source VREF and may be initialized to the reference voltage VREF. In addition, when the first switch SW1 is turned-off according to the initialization control signal PRE of turn-off level, the reference line REFL may be separated from the reference voltage source VREF.

A second switch SW2 may connect or disconnect the AD converter ADC and the reference line REFL according to a sampling control signal SAM. When the second switch SW2 is turned-on in response to the sampling control signal SAM of turn-on level, the reference line REFL may be connected to the AD converter ADC. The AD converter ADC may sense a voltage charged in the reference line REFL. Also, when the second switch SW2 is turned-off according to the sampling control signal SAM of turn-off level, the reference line REFL may be separated from the AD converter ADC.

The sensing transistor SET may be turned-on in response to the scan signal Scan applied through the scan line SCANL. When the sensing transistor SET is turned-on, the reference voltage (or initialization voltage) Vref applied through the reference line REFL may be transferred to the other end of the capacitor Cst. In addition, the reference voltage Vref may also be applied to the source electrode (e.g., the second electrode) of the driving transistor DT.

The capacitor Cst may maintain the data voltage Vdata supplied to the driving transistor DT for one frame. Specifically, the first electrode of the capacitor Cst may be connected to the gate electrode of the driving transistor DT, and the second electrode of the capacitor Cst may be connected to the source electrode of the driving transistor DT. The capacitor Cst may be charged with the driving voltage Vgs corresponding to the data voltage Vdata transferred through the switching transistor SWT, and may supply the charged driving voltage Vgs to the driving transistor DT.

The driving transistor DT may generate a driving current Ids from first power source EVDD supplied from a pixel power line VDDL and may supply the driving current Ids to the anode electrode of the first light emitting element ED1 and the anode electrode of the second light emitting element ED2. The gate electrode of the driving transistor DT may be connected to one end of the capacitor Cst, and the first electrode of the driving transistor DT may be connected to the pixel power line VDDL. In addition, the second electrode of the driving transistor DT may be connected to the anode electrode of the first light emitting element ED1 and the anode electrode of the second light emitting element ED2.

The driving transistor DT may be turned-on according to the driving voltage Vgs charged in the capacitor Cst. When the driving transistor DT is turned-on, the first power source EVDD applied through the pixel power line VDDL may be transmitted to the anode electrode of the first light emitting element ED1 and the anode electrode of the second light emitting element ED2. The driving transistor DT may control the emission intensity of the first and second light emitting elements ED1 and ED2 by controlling the driving current Ids according to the driving voltage Vgs charged in the capacitor Cst.

Each of the first and second light emitting elements ED1 and ED2 may include an anode electrode connected to the driving transistor DT, a cathode electrode supplied with second power source EVSS from a common power line VSSL, and an emission layer between the anode electrode and the cathode electrode. The anode electrode may be an independent electrode for each light emitting element, but the cathode electrode may be a common electrode shared by all light emitting elements. When the driving current Ids is supplied from the driving transistor DT to the light emitting element ED, electrons from the cathode electrode are injected into the emission layer, and holes from the anode electrode are injected into the emission layer, whereby fluorescent or phosphorescent lights are emitted from the emission layer by recombination of electrons and holes, thereby generating light having brightness proportional to a current value of the driving current.

The anode electrode of each of the light emitting elements ED1 and ED2 may be connected to the second electrode of the driving transistor DT, and the cathode electrode of each of the light emitting elements ED1 and ED2 may be connected to the common power line VSSL. The light emitting element ED may emit light in response to the driving current Ids generated by the driving transistor DT.

The control transistor CT may control a connection between the first light emitting element ED1 and the driving transistor DT. The control transistor CT may be controlled by a control signal CS supplied to a control line CTRL and may be turned-on or turned-off. The control transistor CT may be turned-on when the control signal CS is a gate-on voltage, to thereby connect the first light emitting element ED1 and the driving transistor DT. The control transistor CT may be applied with the gate-on voltage through the control line CTRL during a normal driving period. Accordingly, the first light emitting element ED1 may be driven by the driving current Ids from the driving transistor DT, to thereby emit light.

In addition, the control transistor CT may be turned-off when the control signal CS is a gate-off voltage. The control transistor CT may be applied with the gate-off voltage through the control line CTRL during a defect inspection period. The turned-off control transistor CT may form a high resistance region between the first light emitting element ED1 and the driving transistor DT.

In the display panel 110 according to an embodiment of the present disclosure, at least two light emitting elements ED1 and ED2 may be included in one subpixel, and may emit light of the same color. At this time, at least two light emitting elements ED1 and ED2 may be connected to one circuit element to simultaneously emit light. Each of the at least two light emitting elements ED1 and ED2 may correspond to each of at least two divided sub-emission areas.

The display panel 110 according to an embodiment of the present disclosure may include the plurality of light emitting elements ED1 and ED2 in each of the subpixels SP1, SP2, SP3, and SP4. In the display panel 110 according to an embodiment of the present disclosure, when foreign substances are introduced into one of the plurality of light emitting elements ED1 and ED2 and a short occurs between the anode electrode and the cathode electrode, the light emitting element in which the short occurs may be separated from the light emitting element in which the short doesn't occur, whereby only the light emitting element in which the short occurs may be darkened.

In order to minimize or reduce the size of the darkened area, the display panel 110 according to an embodiment of the present disclosure is required to accurately detect the light emitting element in which the short occurs. The display panel 110 according to an embodiment of the present disclosure may provide the high resistance region between one of the plurality of light emitting elements ED1 and ED2 and the driving transistor DT, and may accurately detect the light emitting device in which the short occurs by the use of the high resistance region.

Hereinafter, a structure of detecting the light emitting element in which the short occurs and a method of detecting the light emitting element in which the short occurs will be described in more detail with reference to FIGS. 5 to 17.

Figure 5:
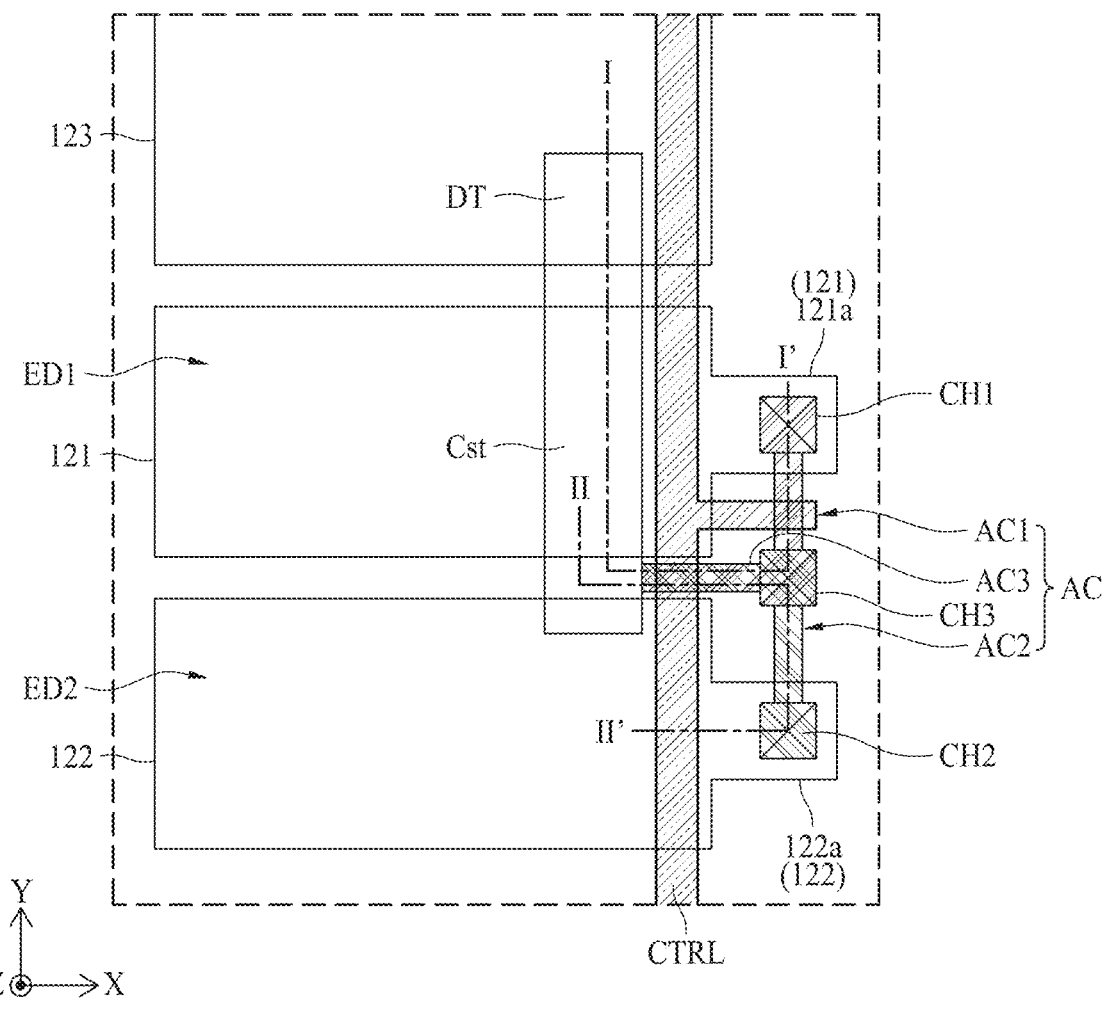
FIG. 5 is a plan view illustrating an example of a first light emitting element and a second light emitting element connected to one circuit element.
Figure 6:
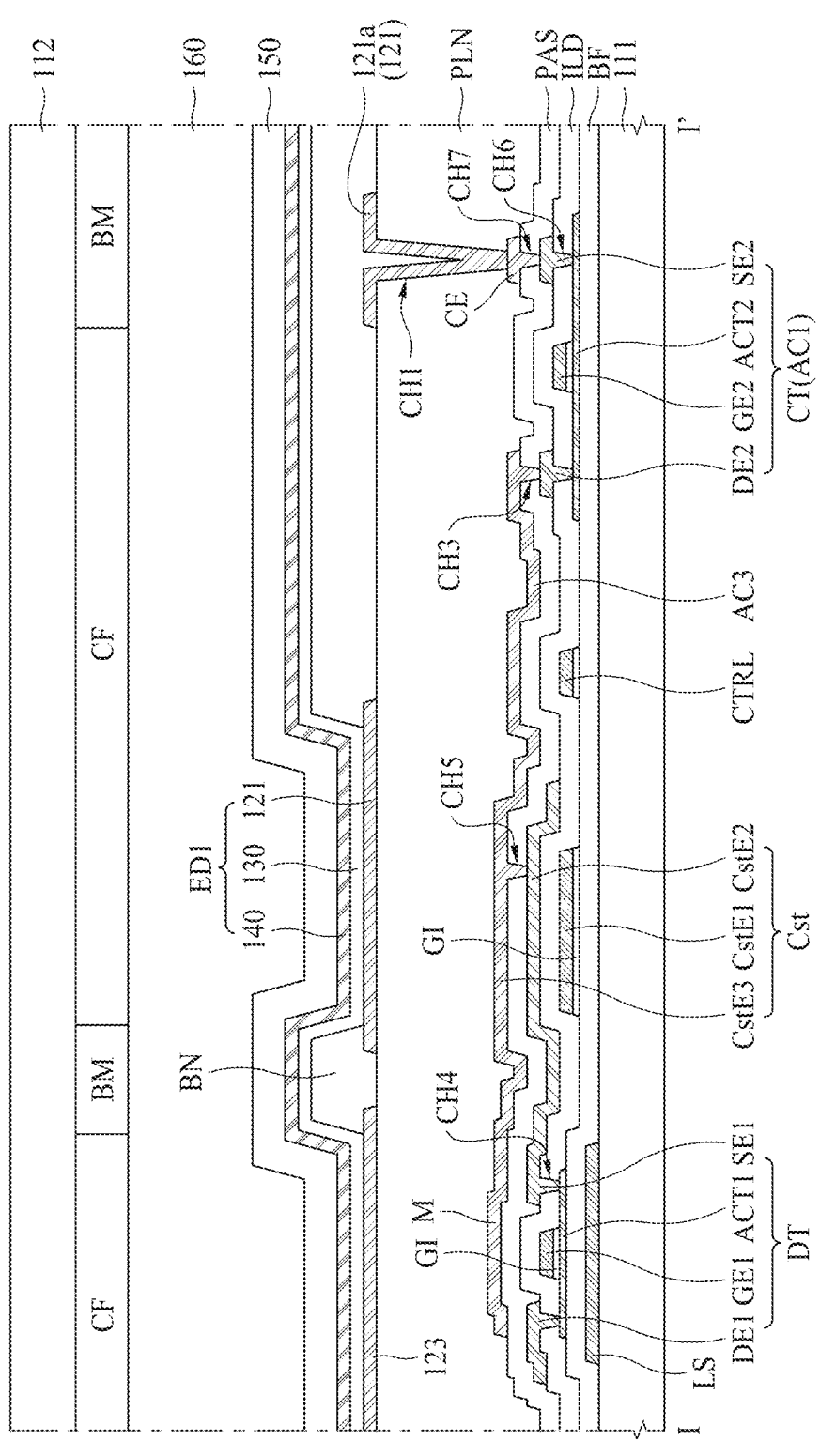
FIG. 6 is a cross-sectional view illustrating an example along I-I' of FIG. 5.
Figure 7:
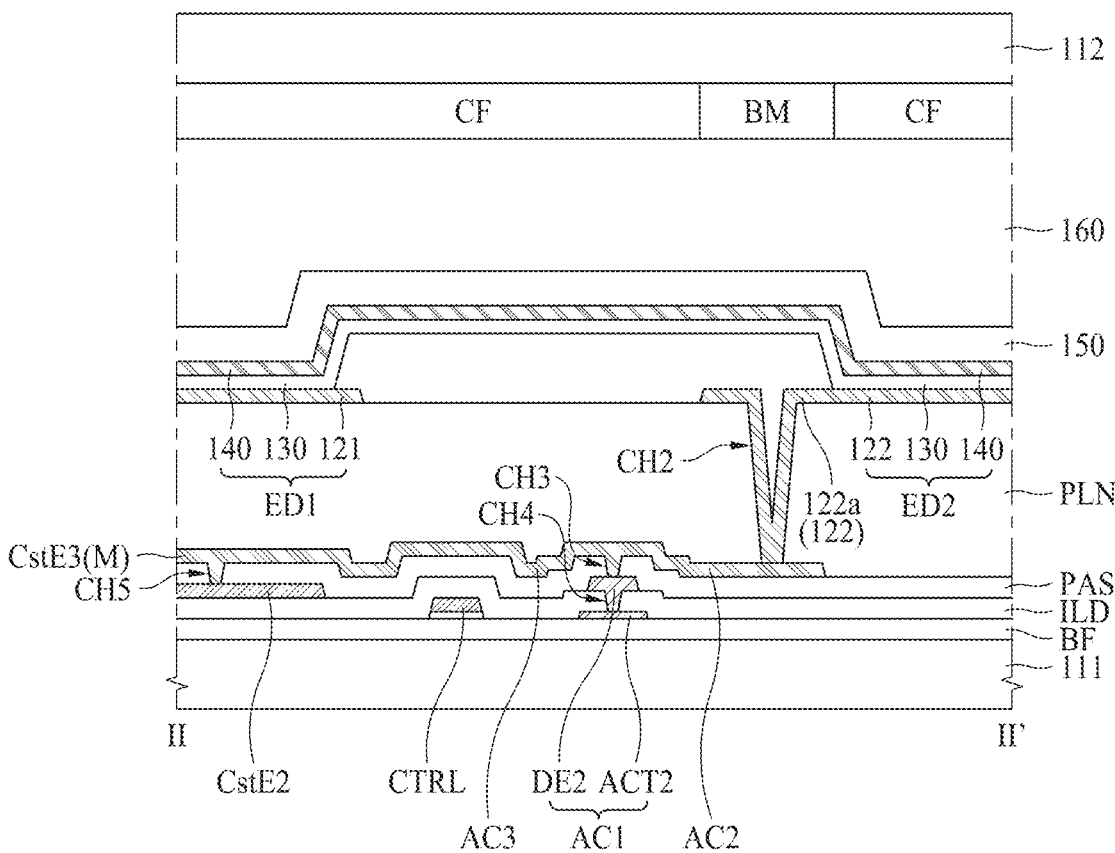
FIG. 7 is a cross-sectional view illustrating an example along II-II' of FIG. 5.
Figure 8:
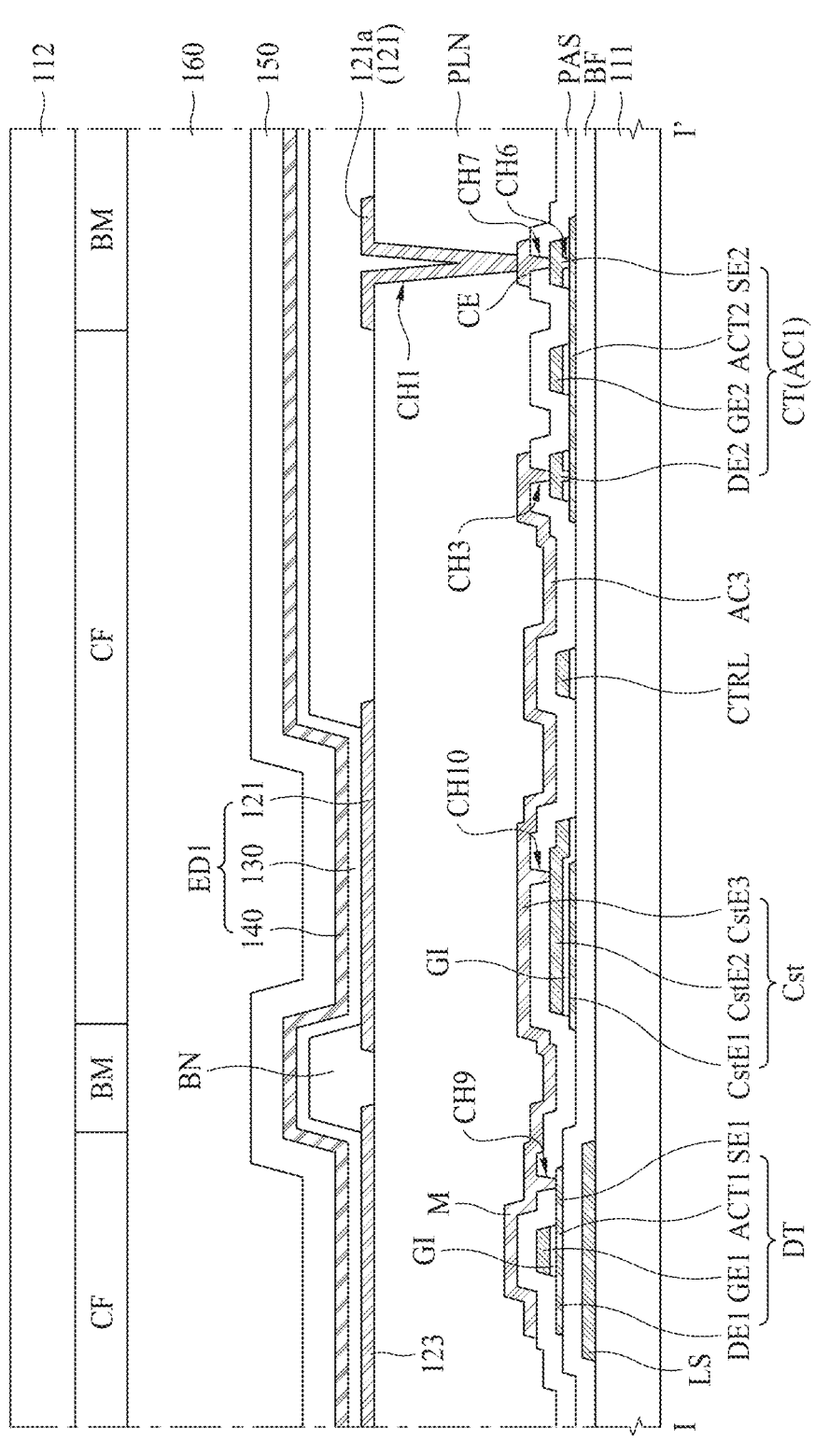
FIG. 8 is a cross-sectional view illustrating another example along I-I' of FIG. 5.

FIG. 5 is a plan view illustrating an example of the first light emitting element and the second light emitting element connected to one circuit element, FIG. 6 is a cross-sectional view illustrating an example along I-I' of FIG. 5, FIG. 7 is a cross-sectional view illustrating another example along II-II' of FIG. 5, and FIG. 8 is a cross-sectional view illustrating another example along I-I' of FIG. 5.

Referring to FIG. 5, each of the plurality of subpixels SP1, SP2, SP3, and SP4 may include a circuit element including a capacitor Cst, a thin film transistor, and the like, and at least two light emitting elements ED1 and ED2. The thin film transistor may include a switching transistor, a sensing transistor, and a driving transistor DT.

The driving transistor DT includes an active layer ACT, a gate electrode GE, a source electrode SE, and a drain electrode DE. The capacitor Cst may include three capacitor electrodes CstE1, CstE2, and CstE3, but not limited thereto. According to one embodiment, the capacitor Cst may include two capacitor electrodes.

Referring to FIGS. 5, 6, and 7, a light shielding layer LS may be provided on a first substrate 111. The light shielding layer LS may be provided in the area where the driving transistor DT is formed to block external light incident on the active layer ACT1 of the driving transistor DT.

The light shielding layer LS may be formed in a single layer or multiple layers including any one of molybdenum Mo, aluminum Al, chromium Cr, gold Au, titanium Ti, nickel Ni, neodymium Nd, and copper Cu, or an alloy thereof.

A buffer layer BF may be disposed on the light shielding layer LS. The buffer layer BF may be provided to protect the driving transistor DT and the capacitor Cst from impurities such as hydrogen and moisture penetrating through the first substrate 111 vulnerable to moisture permeation. The buffer layer BF may have a single-layered structure or multi-layered structure including an inorganic insulating material such as silicon oxide SiOx, silicon nitride SiNx, and aluminum oxide Al2O3.

The driving transistor DT and the capacitor Cst may be disposed on the buffer layer BF. The driving transistor DT may include the active layer ACT1, the gate electrode GE1, the source electrode SE1, and the drain electrode DE1 disposed on the buffer layer BF.

A gate insulating layer GI may be provided between the active layer ACT1 and the gate electrode GE1 of the driving transistor DT. As shown in FIG. 6, the gate insulating layer GI may be patterned only in the area where the gate electrode GE1 is provided, but not limited thereto. In another embodiment, the gate insulating layer GI may be formed to cover the active layer ACT1 of the driving transistor DT.

An interlayer insulating layer ILD may be disposed between the gate electrode GE1 and the source electrode SE1/the drain electrode DE1 of the driving transistor DT. The source electrode SE1 and the drain electrode DE1 of the driving transistor DT may be respectively connected to a source region and a drain region of the active layer ACT1 through a fourth contact hole CH4 penetrating the interlayer insulating layer ILD.

In addition, one of the source electrode SE1 and the drain electrode DE1 of the driving transistor DT may be connected to the light shielding layer LS through a contact hole passing through the interlayer insulating layer ILD and the buffer layer BF. The light shielding layer LS may be electrically connected to one of the source electrode SE1 and the drain electrode DE1 of the driving transistor DT so as not to operate as a floating gate. When the light shielding layer LS is floated without being connected to other electrodes, the threshold voltage of the driving transistor DT may be changed by the floated light shielding layer LS. The display panel 110 according to an embodiment of the present disclosure may electrically connect the light shielding layer LS to one of the source electrode SE1 and the drain electrode DE1 of the driving transistor DT, thereby minimizing or reducing a variation in the threshold voltage of the driving transistor DT.

The active layer ACT1 of the driving transistor DT may be formed of a silicon-based semiconductor material or an oxide-based semiconductor material. The gate electrode GE1, the source electrode SE1, and the drain electrode DE1 of the driving bombe DT may be formed in a single layer or multiple layers including any one of molybdenum Mo, aluminum Al, chromium Cr, gold Au, titanium Ti, nickel Ni, neodymium Nd, and copper Cu, or an alloy thereof.

The gate insulating layer GI and the interlayer insulating layer ILD may have a single-layered or multi-layered structure including an inorganic insulating material such as silicon oxide SiOx, silicon nitride SiNx, or aluminum oxide Al2O3.

In addition, the capacitor Cst may include a first capacitor electrode CstE1, a second capacitor electrode CstE2, and a third capacitor electrode CstE3. At least one of the first capacitor electrode CstE1, the second capacitor electrode CstE2, and the third capacitor electrode CstE3 may be formed of the same material on the same layer as one of the active layer ACT1, the gate electrode GE1, the source electrode SE1, and the drain electrode DE1 of the driving transistor DT. For example, as shown in FIG. 6, the first capacitor electrode CstE1 may be formed of the same material on the same layer as the gate electrode GE1 of the driving transistor DT, and the second capacitor electrode CstE2 may be formed of the same material on the same layer as the source electrode SE1 of the driving transistor DT. The second capacitor electrode CstE2 may extend from the source electrode SE1 of the driving transistor DT, but not limited thereto.

In addition, FIG. 6 illustrates that the source electrode SE1 and the drain electrode DE1 of the driving transistor DT are provided in the separate layer, but not limited thereto. In another embodiment, as shown in FIG. 8, each of the source region and the drain region of the active layer ACT1 may correspond to the source electrode SE1 and the drain electrode DE1 of the driving transistor DT. In this case, as shown in FIG. 8, the first capacitor electrode CstE1 may be formed of the same material on the same layer as the active layer ACT1 of the driving transistor DT, and the second capacitor electrode CstE2 may be formed of the same material on the same layer as the gate electrode GE1 of the driving transistor DT. The second capacitor electrode CstE2 may be electrically connected to the source region of the active layer ACT1, for example, the source electrode SE through a metal layer M. The second capacitor electrode CstE2 may be connected to the metal layer M connected to the source electrode SE of the driving transistor DT through a tenth contact hole CH10.

An insulating layer PAS may be provided on the driving transistor DT. The insulating layer PAS may have a single-layered or multi-layered structure including an inorganic insulating material such as silicon oxide SiOx, silicon nitride SiNx, or aluminum oxide Al2O3.

A metal layer M may be provided on the insulating layer PAS. The metal layer M may be disposed on the driving transistor DT and may be provided to cover the gate electrode GE1 of the driving transistor DT in a plan view. The metal layer M may be electrically connected to one of the source electrode SE1 and the drain electrode DE1 of the driving transistor DT. For example, the metal layer M may be electrically connected to the source electrode SE1 of the driving transistor DT through a fifth contact hole CH5 passing through the insulating layer PAS.

In an embodiment, as shown in FIGS. 5 and 6, the display panel 110 may be disposed such that the driving transistor DT of the subpixel overlaps the anode electrode 123 of the adjacent subpixel. In this case, a parasitic capacitance may occur between the driving transistor DT of the subpixel and the anode electrode 123 of the adjacent subpixel.

Specifically, the parasitic capacitance may occur between the gate electrode GE1 of the driving transistor DT of the subpixel and the anode electrode 123 of the adjacent sub-pixel. The voltage of the gate electrode GE1 in the driving transistor DT of the subpixel may increase by the parasitic capacitance when the adjacent subpixel is driven. As the voltage of the gate electrode GE1 of the driving transistor DT increases, the driving voltage Vgs of the capacitor Cst may increase. Furthermore, the driving current Ids supplied to the anode electrodes 121 and 122 of the subpixel may increase. Accordingly, the subpixel may not emit light with a desired luminance while its luminance increases or decreases. For example, a grayscale defect may occur in the subpixel.

The display panel 110 according to an embodiment of the present disclosure may remove the parasitic capacitance between the gate electrode GE1 of the driving transistor DT and the anode electrode 123 of the adjacent subpixel by using the metal layer M.

Specifically, in the display panel 110 according to an embodiment of the present disclosure, the metal layer M may be disposed between the driving transistor DT of the subpixel and the anode electrode 123 of the adjacent sub-pixel. The metal layer M may be disposed on at least one of the source electrode SE1 and the drain electrode DE1 of the driving transistor DT and may be electrically connected to one of the source electrode SE1 and the drain electrode DE1 of the driving transistor DT. For example, as shown in FIG. 6, the metal layer M may be disposed on the source electrode SE1 of the driving transistor DT and may be electrically connected to the source electrode SE1 of the driving transistor DT through the fifth contact hole CH5.

The metal layer M may be disposed in the area where the driving transistor DT of the subpixel and the anode electrode 123 of the adjacent subpixel overlap each other. The metal layer M may extend from the area overlapped with the anode electrode 123 of the adjacent subpixel to the area where the subpixel is disposed and may be electrically connected to the anode electrode 120 of the subpixel. At least one of the anode electrode 121 of the first light emitting element ED1 and the anode electrode 122 of the second light emitting element ED2 may be electrically connected to the source electrode SE1 of the driving transistor DT through the metal layer M.

The metal layer M may be formed to cover the gate electrode GE1 of the driving transistor DT in the area where the driving transistor D and the anode electrode 123 of the adjacent subpixel overlap each other in a plan view. The gate electrode GE1 of the driving transistor DT may be in a floating state during a period in which the scan signal Scan (See FIG. 4) is not applied. The gate electrode GE1 of the floating state may be affected by a peripheral signal. Accordingly, when a voltage is applied to the anode electrode 123 of the adjacent subpixel disposed on the gate electrode GE1, the voltage is increased while the voltage is applied to the gate electrode GE1 in the floating state by the parasitic capacitance, thereby increasing the luminance of the sub-pixel.

In the display panel 110 according to an embodiment of the present disclosure, the metal layer M may be disposed between the gate electrode GE1 of the driving transistor DT and the anode electrode 123 of the adjacent subpixel, and the metal layer M may be electrically connected to the source electrode SE1 or the drain electrode DE1 of the driving transistor DT, thereby removing the parasitic capacitance. Accordingly, although the voltage is applied to the anode electrode 123 of the adjacent subpixel, the voltage of the gate electrode GE1 of the driving transistor DT may be not changed in the display panel 110 according to an embodiment of the present disclosure.

In addition, the metal layer M may be disposed to overlap the capacitor Cst in the area where the subpixel is disposed. In this case, the metal layer M may be the third capacitor electrode CstE3 constituting the capacitor Cst in the area overlapped with the capacitor Cst.

In the display panel 110 according to an embodiment of the present disclosure, the third capacitor electrode CstE3 is formed by extending the metal layer M from the adjacent subpixel to the area where the corresponding subpixel is disposed so that it is possible to increase the capacitance of the capacitor Cst in a limited space.

In the display panel 110 according to an embodiment of the present disclosure, the metal layer M and the third capacitor electrode CstE3 may be simultaneously formed through a simple process. Accordingly, the display panel 110 according to an embodiment of the present disclosure may implement process optimization and reduce production energy. In this case, the metal layer M may be referred to as a mediate electrode for connecting the source electrode SE1 of the driving transistor DT with the anode electrodes of the first and second light emitting elements so as to reduce the contact resistance therebetween.

The metal layer M may be formed of an alloy of molybdenum Mo and titanium Ti, but not limited thereto.

A planarization layer PLN for planarizing a step difference due to the driving transistor DT and the capacitor Cst may be provided on the metal layer M. The planarization layer PLN may be formed of an organic layer such as acryl resin, epoxy resin, phenolic resin, polyamide resin, polyimide resin, or the like.

The light emitting elements ED1 and ED2 including the anode electrode 120, emission layer 130, and cathode electrode 140 and a bank BN may be provided on the planarization layer PLN.

The anode electrode 120 may be provided on the planarization layer PLN. The anode electrode 120 may be provided for each of the subpixels SP1, SP2, SP3, and SP4. One anode electrode 120 may be formed in the first subpixel SP1, another anode electrode 120 may be formed in the second subpixel SP2, another anode electrode 120 may be formed in the third subpixel SP3, and another anode electrode 120 may be formed in the fourth subpixel SP4.

The anode electrode 120 may be formed of a metal material having high reflectance, such as a stacked structure Ti/Al/Ti of aluminum and titanium, a stacked structure ITO/Al/ITO of aluminum and ITO, an Ag alloy, a stacked structure ITO/Ag alloy/ITO of Ag alloy and ITO, MoTi alloy, and a stacked structure ITO/MoTi alloy/ITO of MoTi alloy and ITO. The Ag alloy may be an alloy of silver Ag, palladium Pd, and copper Cu. The MoTi alloy may be an alloy of molybdenum Mo and titanium Ti.

The anode electrode 120 may be electrically connected to the driving transistor DT and may be supplied with a data current from the driving transistor DT. More specifically, there may be the plurality of anode electrodes 120 in each of the plurality of subpixels SP1, SP2, SP3, and SP4, and the plurality of anode electrodes 121 and 122 may be connected to the driving transistor DT through an anode connection portion AC.

The anode electrode 120 may include a first anode electrode 121 and a second anode electrode 122, wherein the first anode electrode 121 and the second anode electrode 122 may be spaced apart from each other in the first direction (X-axis direction) or the second direction (Y-axis direction). As the number of the electrodes 121 and 122 included in one anode electrode 120 decreases, an aperture ratio may increase, but an area darkened by foreign substances may increase, thereby reducing the yield. On the other hand, as the number of electrodes 121 and 122 included in one anode electrode 120 increases, an aperture ratio may decrease, but an area darkened by foreign substances may decrease, thereby increasing the yield.

Hereinafter, for convenience of description, it would be described that the anode electrode 120 includes the first anode electrode 121 and the second anode electrode 122 as an example, but the number thereof is not limited thereto.

The first anode electrode 121 may be disposed in the first sub-emission area EA11, EA21, EA31, and EA41, and may form the first light emitting element ED1 together with the emission layer 130 and the cathode electrode 140. The second anode electrode 122 may be disposed in the second sub-emission area EA12, EA22, EA32, and EA42, and may form the second light emitting element ED2 together with the emission layer 130 and the cathode electrode 140. The first anode electrode 121 and the second anode electrode 122 may be spaced apart from each other in the same layer.

The anode connection portion AC may connect the first anode electrode 121 and the second anode electrode 122 to the driving transistor DT, and may include a first anode connection portion AC1, a second anode connection portion AC2, and a third anode connection portion AC3, as shown in FIG. 5.

The third anode connection portion AC3 may electrically connect the first anode connection portion AC1 and the second anode connection portion AC2 to the driving transistor DT. One end of the third anode connection portion AC3 may be electrically connected to one of the source electrode SE1 and the drain electrode DE1 of the driving transistor DT. For example, the third anode connection portion AC3 may be formed of the same material on the same layer as the metal layer M. The third anode connection portion AC3 may be connected to the metal layer M at one end. The third anode connection portion AC3 may extend from the metal layer M by a predetermined length in the outer direction. The third anode connection portion AC3 may be electrically connected to the source electrode SE1 of the driving transistor DT through the metal layer M.

The first anode connection portion AC1 may electrically connect the first anode electrode 121 and the driving transistor DT through the third anode connection portion AC3. Specifically, the first anode connection portion AC1 may include a control transistor CT including an active layer ACT2, a gate electrode GE2, a source electrode SE2, and a drain electrode DE2. The gate electrode GE2 of the control transistor CT may be provided on the active layer ACT2 with the gate insulating layer GI interposed therebetween. The source electrode SE2 and the drain electrode DE2 of the control transistor CT may be connected to a source region and a drain region of the active layer ACT2 through a sixth contact hole CH6, respectively.

The active layer ACT2 of the control transistor CT may be formed of the same material on the same layer as the active layer ACT1 of the driving transistor DT, and the gate electrode GE2 of the control transistor CT may be formed of the same material on the same layer as the gate electrode GE1 of the driving transistor DT. In addition, the source electrode SE2 and the drain electrode DE2 of the control transistor CT may be formed of the same material on the same layer as the source electrode SE1 and the drain electrode DE1 of the driving transistor DT.

One of the source electrode SE2 and the drain electrode DE2 of the control transistor CT may be connected to the driving transistor DT. For example, the third anode connection portion AC3 may be connected to the drain electrode DE2 of the control transistor CT through a third contact hole CH3. As shown in FIG. 6, the third anode connection portion AC3 may extend from the metal layer M. Since the metal layer M is electrically connected to the source electrode SE1 of the driving transistor DT, the drain electrode DE2 of the control transistor CT may be electrically connected to the source electrode SE1 of the driving transistor DT through the third anode connection portion AC3 and the metal layer M.

The other of the source electrode SE2 and the drain electrode DE2 of the control transistor CT may be connected to the first anode electrode 121 of the first light emitting element ED1. The first anode electrode 121 may include a first protrusion 121a protruding outward from one side thereof. The other of the source electrode SE2 and the drain electrode DE2 of the control transistor CT may at least partially overlap the first protrusion 121a of the first anode electrode 121.

The other of the source electrode SE2 and the drain electrode DE2 of the control transistor CT may be electrically connected to the first protrusion 121a of the first anode electrode 121. The other of the source electrode SE2 and the drain electrode DE2 of the control transistor CT may be disposed on the different layer from the first anode electrode 121 and may be electrically connected to the first anode electrode 121 through at least one connection electrode CE.

For example, as shown in FIG. 6, the source electrode SE2 of the control transistor CT may be electrically connected to the first anode electrode 121 through one connection electrode CE. The connection electrode CE may be connected to the source electrode SE2 of the control transistor CT through a seventh contact hole CH7, and the first protrusion 121a of the first anode electrode 121 may be connected to the connection electrode CE through a first contact hole CH1. As described above, the first protrusion 121a of the first anode electrode 121 may be electrically connected to the source electrode SE2 of the control transistor CT through the connection electrode CE, but not limited thereto.

As another example, the first protrusion 121a of the first anode electrode 121 may be electrically connected to the source electrode SE2 of the control transistor CT through two or more connection electrodes CE. As another example, the first protrusion 121a of the first anode electrode 121 may be directly connected to the source electrode SE2 of the control transistor CT.

In addition, the control transistor CT of the first anode connection portion AC1 may be connected to the control line CTRL by the gate electrode GE2. As shown in FIG. 5, the control line CTRL may extend in the second direction (e.g., Y-axis direction) between the driving transistor DT and the first anode connection portion AC1. The gate electrode GE2 of the control transistor CT may be connected to the control line CTRL and may be applied with the control signal CS (See FIG. 4) from the control line CTRL.

In the normal driving period, the control transistor CT may be turned-on by the applied control signal CS (See FIG. 4) corresponding to the gate-on voltage from the control line CTRL. The control transistor CT may be turned-on during the normal driving period, to thereby electrically connect the first light emitting element ED1 to the driving transistor DT. Accordingly, the first light emitting element ED1 may be driven by the driving current Ids from the driving transistor DT, to thereby emit light.

On the other hand, in the defect inspection period, the control transistor CT may be turned-off by the applied control signal CS (See FIG. 4) corresponding to the gate-off voltage from the control line CTRL. The control transistor CT may be turned-off during the defect inspection period, to thereby form the high resistance region between the first light emitting element ED1 and the driving transistor DT.

The second anode connection portion AC2 may electrically connect the second anode electrode 122 and the driving transistor DT through the third anode connection portion AC3. The second anode connection portion AC2 may include a first anode connection line provided over the driving transistor DT.

One end of the first anode connection line of the second anode connection portion AC2 may be electrically connected to one of the source electrode SE and the drain electrode DE of the driving transistor DT. For example, the third anode connection portion AC3 may include a second anode connection line having one end electrically connected to the driving transistor DT and extending in the outer direction by a predetermined length. The other end of the second anode connection line of the third anode connection portion AC3 may be connected to the first anode connection line of the second anode connection portion AC2. In this case, as shown in FIG. 7, the first anode connection line of the second anode connection portion AC2 may extend from the second anode connection line of the third anode connection portion AC3. The second anode connection line of the third anode connection portion AC3 may extend from the metal layer M, and the metal layer M may be electrically connected to the source electrode SE1 of the driving transistor DT. As a result, the first anode connection line of the second anode connection portion AC2 may be electrically connected to the source electrode SE1 of the driving transistor DT through the second anode connection line of the third anode connection portion AC3 and the metal layer M.

The other end of the first anode connection line of the second anode connection portion AC2 may be connected to the second anode electrode 122 of the second light emitting element ED2. The second anode electrode 122 may include a second protrusion 122a protruding outward from one side thereof. The other end of the first anode connection line of the second anode connection portion AC2 may at least partially overlap the second protrusion 122a of the second anode electrode 122.

The other end of the first anode connection line of the second anode connection portion AC2 may be electrically connected to the second protrusion 122a of the second anode electrode 122. As shown in FIG. 7, the first anode connection line of the second anode connection portion AC2 may be disposed on the different layer from the second anode electrode 122 and may be electrically connected to the second protrusion 122a of the second anode electrode 122 through a second contact hole CH2, but not limited thereto. As another example, the first anode connection line of the second anode connection portion AC2 may be electrically connected to the second protrusion 122a of the second anode electrode 122 through at least one connection electrode.

In the display panel 110 according to an embodiment of the present disclosure, the first anode connection portion AC1 connected to the first anode electrode 121 and the second anode connection portion AC2 connected to the second anode electrode 122 may be formed to have different resistances. Specifically, the resistance of the first anode connection portion AC1 may be greater than the resistance of the second anode connection portion AC2.

The first anode connection portion AC1 may be implemented as a control transistor CT. The control transistor CT may have a high first resistance because a current is difficult to flow in a turn-off state. In this case, the first anode connection portion AC1 or the control transistor may also be referred to as a variable resistance portion or variable resistance anode connection portion.

Unlike the first anode connection portion AC1, the second anode connection portion AC2 may be implemented as an anode connection line which is not a transistor. The anode connection line of the second anode connection portion AC2 may have a relatively low resistance compared to the control transistor CT in the turn-off state.

The display panel 110 according to an embodiment of the present disclosure is characterized in that the first anode connection portion AC1 connected to the first anode electrode 121 and the second anode connection portion AC2 connected to the second anode electrode 122 have different resistances. The display panel 110 according to an embodiment of the present disclosure may detect the electrode in which a short occurs between the first anode electrode 121 and the second anode electrode 122 by using the resistance difference between the first anode connection portion AC1 and the second anode connection portion AC2. A method of detecting the electrode in which a short occurs will be described in detail with reference to FIGS. 11 to 17.

The bank BN may be provided on the planarization layer PLN. The bank BN may be formed to cover the edge of each of the anode electrodes 120 and to expose a portion of each of the anode electrodes 120. Accordingly, the bank BN may prevent or reduce a current from being concentrated at an end of each of the anode electrodes 120 so that it is possible to prevent or reduce a deterioration of light emitting efficiency.

The bank BN may define the emission areas EA11, EA12, EA21, EA22, EA31, EA32, EA41, and EA42 of the subpixels SP1, SP2, SP3, and SP4. The emission areas EA11, EA12, EA21, EA22, EA31, EA32, EA41, and EA42 of the subpixels SP1, SP2, SP3, and SP4, respectively, are areas in which the anode electrode 120, the emission layer 130, and the cathode electrode 140 are sequentially stacked to allow holes from the anode electrode 120 and electrons from the cathode electrode 140 to be combined with each other in the emission layer 130 to emit light. In this case, since the area where the bank BN is formed does not emit light, the area where the bank BN is formed becomes a non-emission area (not shown). The area where the anode electrode 120 is exposed without forming the bank BN becomes the emission area EA11, EA12, EA21, E22, EA31, EA32, EA41, and EA42.

The bank BN may be formed of an organic layer such as acryl resin, epoxy resin, phenolic resin, polyamide resin, polyimide resin, or the like.

The emission layer 130 may be provided on the anode electrode 120. The emission layer 130 may include a hole transporting layer, an emission material layer, and an electron transporting layer. In this case, when a voltage is applied to the anode electrode 120 and the cathode electrode 140, the holes and electrons move to the emission layer through the hole transporting layer and the electron transporting layer, respectively, and are combined with each other in the emission material layer to emit light.

In an embodiment, the emission layer 130 may be a common layer commonly formed in the subpixels SP1, SP2, SP3, and SP4. In this case, the emission layer may be a white emission layer for emitting white light. In this case, the emission layer 130 may be formed in the non-emission area (not shown) between the subpixels SP1, SP2, SP3, and SP4 (not shown) as well as the subpixels SP1, SP2, SP3, and SP4. The emission layer 130 may be formed in the subpixels SP1, SP2, SP3, and SP4 and may be continuously formed between the subpixels SP1, SP2, SP3, and SP4.

In another embodiment, the emission layer 130 may be formed for each of the subpixels SP1, SP2, SP3, and SP4. For example, a red emission layer for emitting red light may be formed in the first subpixel SP1, a green emission layer for emitting green light may be formed in the second subpixel SP2, a blue emission layer for emitting blue light may be formed in the third subpixel SP3, and a white emission layer for emitting white light may be formed in the fourth subpixel SP4.

The cathode electrode 140 may be provided on the emission layer 130. The cathode electrode 140 may be a common layer commonly formed in the subpixels SP1, SP2, SP3, and SP4 and configured to apply the same voltage to the subpixels SP1, SP2, SP3, and SP4. The cathode electrode 140 may be formed not only in the emission areas EA11, EA12, EA21, E22, EA31, EA32, EA41, and EA42 of the subpixels SP1, SP2, SP3, and SP4 but also in the non-emission area (not shown) between the subpixels SP1, SP2, SP3, and SP4. The cathode electrode 140 may be formed in the subpixels SP1, SP2, SP3, and SP4 and may be continuously formed between the subpixels SP1, SP2, SP3, and SP4.

The cathode electrode 140 may be formed of a transparent conductive material TCO capable of transmitting light therethrough such as indium tin oxide ITO and indium zinc oxide IZO, or a semi-transmissive conductive material such as magnesium Mg, silver Ag, or an alloy of magnesium Mg and silver Ag. When the cathode electrode 140 is formed of a semi-transmissive metal material, a light emission efficiency may be increased by a microcavity.

An encapsulation layer 150 may be provided on the light emitting elements ED1 and ED2. The encapsulation layer 150 may be formed on the cathode electrode 140 and may be configured to cover the cathode electrode 140. The encapsulation layer 150 prevents or reduces oxygen or moisture from permeating into the emission layer 130 and the cathode electrode 140. For example, the encapsulation layer 150 may include at least one inorganic layer, and may further include at least one organic layer. For example, the encapsulating layer 150 may have a structure in which at least one organic layer is disposed between inorganic layers, or a structure in which the at least one inorganic layer and the at least one organic layer are alternately disposed.

A color filter CF may be provided on one surface of a second substrate 112 confronting the first substrate 111. The color filter CF may be patterned for each of the subpixels SP1, SP2, SP3, and SP4.

Specifically, the color filter CF may include a first color filter, a second color filter, a third color filter, and a fourth color filter. The first color filter may be disposed to correspond to the emission areas EA11 and EA12 of the first subpixel SP1 and may be a red color filter which transmits red light. The second color filter may be disposed to correspond to the emission areas EA21 and EA22 of the second subpixel SP2 and may be a green color filter which transmits green light. The third color filter may be disposed to correspond to the emission areas EA31 and EA32 of the third subpixel SP3 and may be a blue color filter which transmits blue light. The fourth color filter may be disposed to correspond to the emission areas EA41 and EA42 of the fourth subpixel SP4 and may be a transparent organic layer. In another example, the fourth color filter may be omitted.

A black matrix BM may be provided between the color filters CF. The black matrix BM may be provided between the subpixels SP1, SP2, SP3, and SP4 to prevent or reduce color mixing between the subpixels SP1, SP2, SP3, and SP4. In addition, the black matrix BM may prevent or reduce light incident from the outside from being reflected to the plurality of signal lines, for example, scan lines, data lines, pixel power lines, common power lines, reference lines, and the like, provided between the subpixels SP1, SP2, SP3, and SP4.

The black matrix BM may include a material which absorbs light, for example, black dye which absorbs all light in the visible light wavelength range.

A filler 160 may be provided between the first substrate 111 provided with the light emitting elements ED1 and ED2 and the second substrate 112 provided with the color filter CF and the black matrix BM. In this case, the filler 160 may use thermosetting resin or UV-curable resin and may be formed of an organic material having an adhesive property. In an embodiment, the filler 160 may include a material which absorbs hydrogen.

It is to be noted that although FIGS. 5-8 of the present disclosure disclose example structure of the pixels, but the present disclosure is not limited thereto, and various other structures of the pixels or sub-pixels may also be possible.

Figure 9:
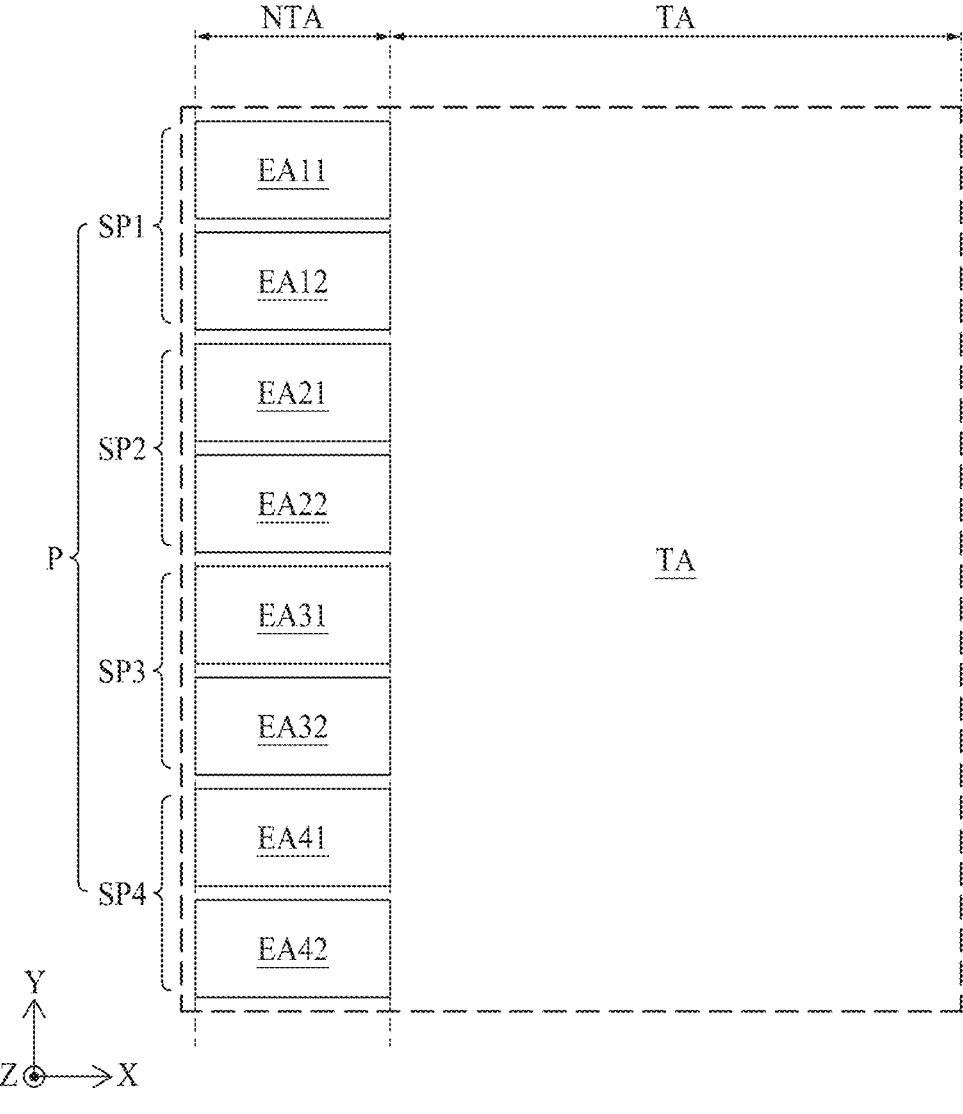
FIG. 9 schematically illustrates another example embodiment of a pixel provided in a region A of FIG. 2.
Figure 10:
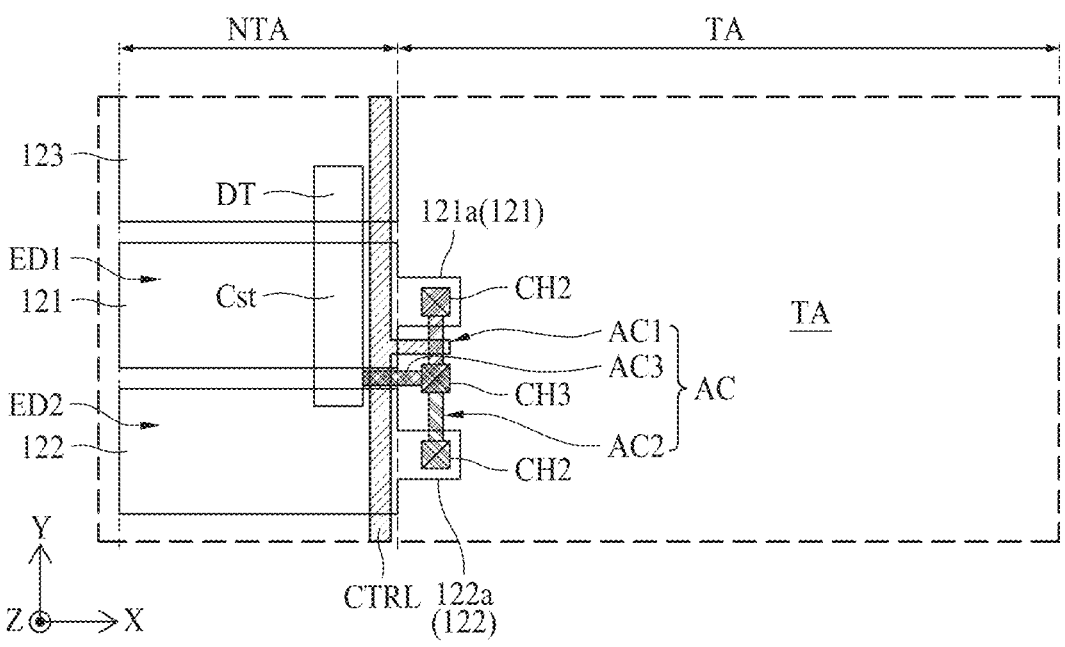
FIG. 10 is a plan view illustrating an example of a first light emitting element and a second light emitting element connected to one circuit element in FIG. 9.

FIG. 9 schematically illustrates another embodiment of a pixel provided in a region A of FIG. 2, and FIG. 10 is a plan view illustrating an example of a first light emitting element and a second light emitting element connected to one circuit element in FIG. 9.

A display panel 110 shown in FIGS. 9 and 10 is different from the display panel 110 shown in FIGS. 3 to 8 in that a transmission area TA is provided. Hereinafter, differences will be mainly described, and the substantially same contents may be omitted.

The display panel 110 according to another embodiment of the present disclosure may include a display area DA and a non-display area NDA (See FIG. 2). As shown in FIG. 9, the display area DA may include a first area NTA in which a plurality of subpixels SP1, SP2, SP3, and SP4 are disposed, and a second area TA in which a plurality of subpixels SP1, SP2, SP3, and SP4 are not disposed. The first area NTA may be a non-transmission area which does not transmit most of the light incident from the outside. The second area TA may be a transmission area through which most of light incident from the outside passes. For example, the transmission area TA may be an area in which the light transmittance is greater than a %, and the non-transmission area NTA may be an area in which the light transmittance is less than β%. Herein, 'a' may be a value greater than 'B'. The display panel 110 according to another embodiment of the present disclosure may view an object or a background located on a rear surface (or back surface) of the display panel 110 through transmission areas TA.

The non-transmission area NTA may include emission areas EA1, EA2, EA3, and EA4 provided with the plurality of subpixels SP1, SP2, SP3, and SP4 to emit light, and a non-emission area provided between each of the emission areas EA1, EA2, EA3, and EA4. Also, the non-transmission area NTA may include a plurality of signal lines DL, VDDL, VSSL, and REFL (See FIG. 4), and circuit elements DT, SWT, SET, and Cst (See FIG. 4). The plurality of signal lines DL, VDDL, VSSL, and REFL may extend in the second direction (e.g., Y-axis direction) in the non-transmission area NTA disposed between the transmission areas TA.

In the display panel 110 according to another embodiment of the present disclosure, since the transmission area TA is provided in the display area DA, the area of the non-transmission area NTA including the emission areas EA1, EA2, EA3, and EA4 is reduced. Since the display panel 110 according to another embodiment of the present disclosure needs to include the plurality of light emitting elements, the plurality of signal lines and the plurality of circuit elements in the narrow non-transmission area NTA, the plurality of light emitting elements may be formed to overlap the plurality of signal lines and the plurality of circuit elements. Accordingly, the display panel 110 according to another embodiment of the present disclosure may be disposed such that the plurality of signal lines DL, VDDL, VSSL, and REFL (See FIG. 4) and the circuit elements DT, SWT, SET, and Cst (See FIG. 4) overlap the emission areas EA1, EA2, EA3, and EA4.

The first light emitting element ED1 and the second light emitting element ED2 provided in each of the subpixels SP1, SP2, SP3, and SP4 may be spaced apart from each other in the first direction (X-axis direction) or the second direction (Y-axis direction) in the non-transmission area NTA. The first light emitting element ED1 may be disposed in the first sub-emission area EA11, EA21, EA31, and EA41 and may include a first anode electrode 121, an emission layer 130, and a cathode electrode 140. The second light emitting element ED2 may be disposed in the second sub-emission area EA12, EA22, EA32, and EA42 and may include a second anode electrode 122, an emission layer 130, and a cathode electrode 140.

The first light emitting element ED1 and the second light emitting element ED2 may be connected to one circuit element by using an anode connection portion AC. The anode connection portion AC may be configured to connect the first anode electrode 121 and the second anode electrode 122 to the driving transistor DT, and may include a first anode connection portion AC1, a second anode connection portion AC2, and a third anode connection portion AC3, as shown in FIG. 10.

The third anode connection portion AC3 may electrically connect the first anode connection portion AC1 and the second anode connection portion AC2 to the driving transistor DT. One end of the third anode connection portion AC3 may be electrically connected to one of a source electrode SE1 and a drain electrode DE1 of the driving transistor DT. For example, the third anode connection portion AC3 may be formed of the same material on the same layer as a metal layer M. The third anode connection portion AC3 may be connected to the metal layer M at one end and may extend from the metal layer M by a predetermined length in the outer direction. The third anode connection portion AC3 may be electrically connected to the source electrode SE1 of the driving transistor DT through the metal layer M.

The first anode connection portion AC1 may electrically connect the first anode electrode 121 and the driving transistor DT through the third anode connection portion AC3. The first anode connection portion AC1 may include a control transistor CT including an active layer ACT2, a gate electrode GE2, a source electrode SE2, and a drain electrode DE2.

One of the source electrode SE2 and the drain electrode DE2 of the control transistor CT may be connected to the driving transistor DT. For example, the drain electrode DE2 of the control transistor CT may be electrically connected to the third anode connection portion AC3 through a third contact hole CH3. Since the third anode connection portion AC3 is connected to the metal layer M and the metal layer M is electrically connected to the source electrode SE1 of the driving transistor DT, the drain electrode DE2 of the control transistor CT may be electrically connected to the source electrode SE1 of the driving transistor DT through the third anode connection portion AC3 and the metal layer M.

The other of the source electrode SE2 and the drain electrode DE2 of the control transistor CT may be connected to the first anode electrode 121 of the first light emitting element ED1. The first anode electrode 121 may include a first protrusion 121a protruding from one side toward the transmission area TA. The other of the source electrode SE2 and the drain electrode DE2 of the control transistor CT may at least partially overlap the first protrusion 121a of the first anode electrode 121.

The other of the source electrode SE2 and the drain electrode DE2 of the control transistor CT may be electrically connected to the first protrusion 121a of the first anode electrode 121. For example, the source electrode SE2 of the control transistor CT may be electrically connected to the first protrusion 121a of the first anode electrode 121.

The second anode connection portion AC2 may electrically connect the second anode electrode 122 and the driving transistor DT through the third anode connection portion AC3. The second anode connection portion AC2 may include a first anode connection line provided on the driving transistor DT.

One end of the first anode connection line of the second anode connection portion AC2 may be electrically connected to one of the source electrode SE and the drain electrode DE of the driving transistor DT. For example, the first anode connection line of the second anode connection portion AC2 may extend from the third anode connection portion AC3. The first anode connection line of the second anode connection portion AC2 may be electrically connected to the source electrode SE1 of the driving transistor DT through the third anode connection portion AC3 and the metal layer M.

The other end of the first anode connection line of the second anode connection portion AC2 may be connected to the second anode electrode 122 of the second light emitting element ED2. The second anode electrode 122 may include a second protrusion 122a protruding from one side toward the transmission area TA. The other end of the first anode connection line of the second anode connection portion AC2 may at least partially overlap the second protrusion 122a of the second anode electrode 122. The other end of the first anode connection line of the second anode connection portion AC2 may be electrically connected to the second protrusion 122a of the second anode electrode 122.

The first anode connection portion AC1 and the second anode connection portion AC2 may be disposed between the first protrusion 121a of the first anode electrode 121 and the second protrusion 122a of the second anode electrode 122. Unlike the description shown in FIG. 10, each of the first anode connection portion AC1 and the second anode connection portion AC2 may be connected to the same third anode connection portion AC3 and may be electrically connected to the driving transistor DT.

The anode connection portion AC including the first anode connection portion AC1, the second anode connection portion AC2, and the third anode connection portion AC3 may protrude from one side of the non-transmission area NTA toward the transmission area TA. A portion in which the anode connection portion AC is formed in the protruding area may be the non-transmission area NTA. Accordingly, the transmission area TA of the display panel 110 may be reduced in size due to the protruding anode connection portion AC.

In the display panel 110 according to an embodiment of the present disclosure, the first anode connection portion AC1 and the second anode connection portion AC2 are connected to the same single third anode connection portion AC3 so that it is possible to minimize or reduce the area where the anode connection portion AC is formed and to minimize or reduce loss of transparency by the anode connection portion AC.

Hereinafter, a method of detecting the defective light emitting element and a method of repairing the defective light emitting element will be described in detail with reference to FIGS. 11 to 17.

Figure 11:
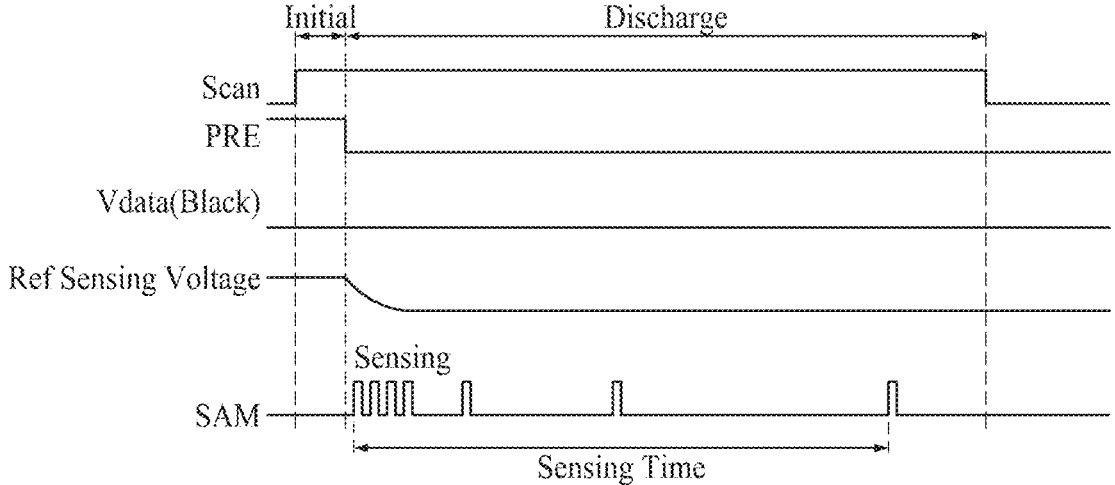
FIG. 11 illustrates an example driving waveform in a defect inspection period.
Figure 12:
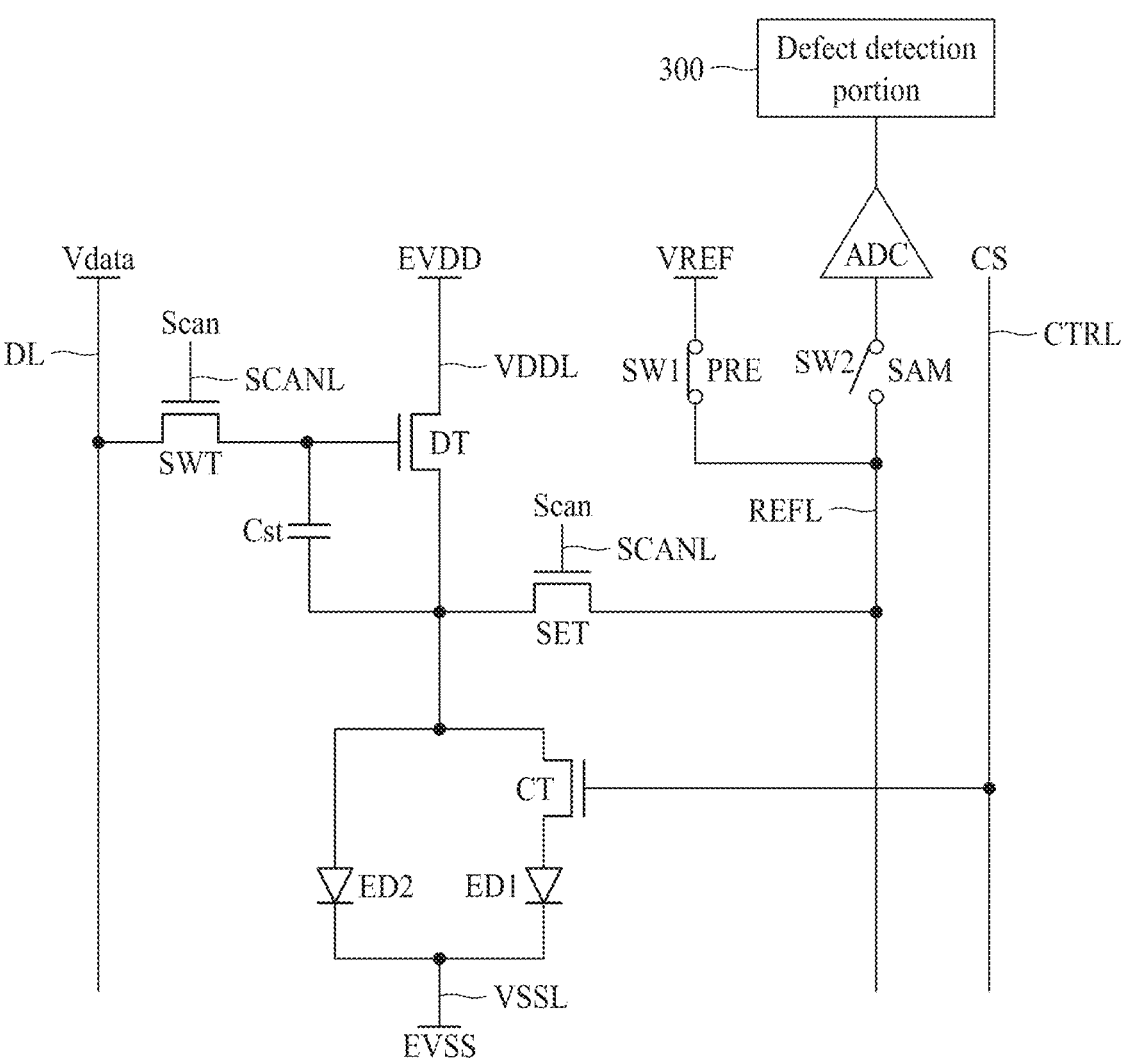
FIG. 12 describes an example operation of a subpixel during an initialization period.
Figure 13:
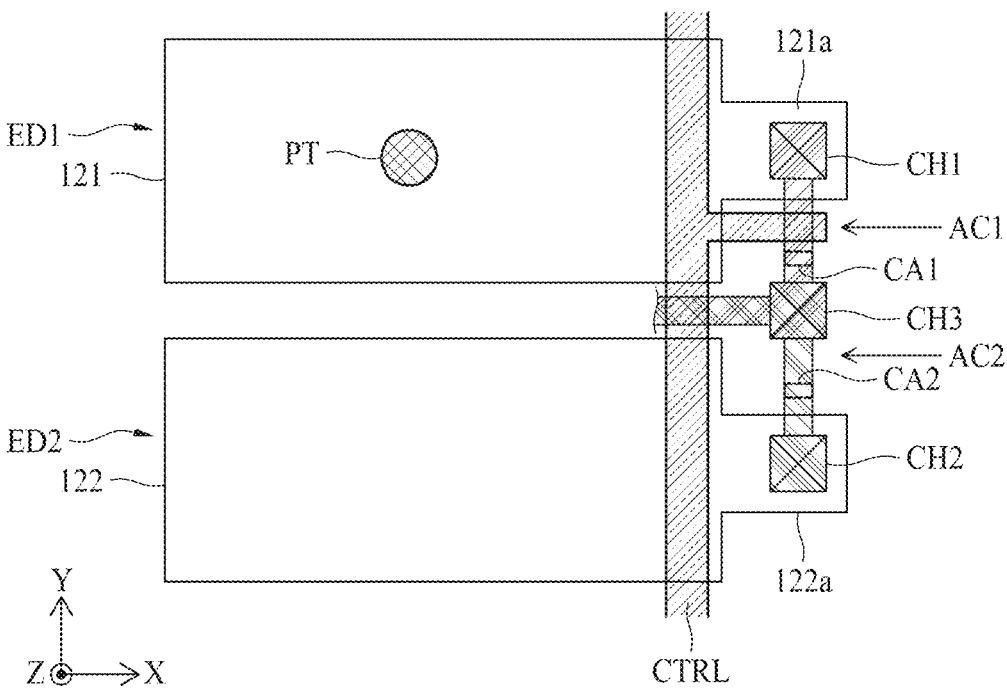
FIG. 13 illustrates an example in which a defect occurs in a first light emitting element.
Figure 14:
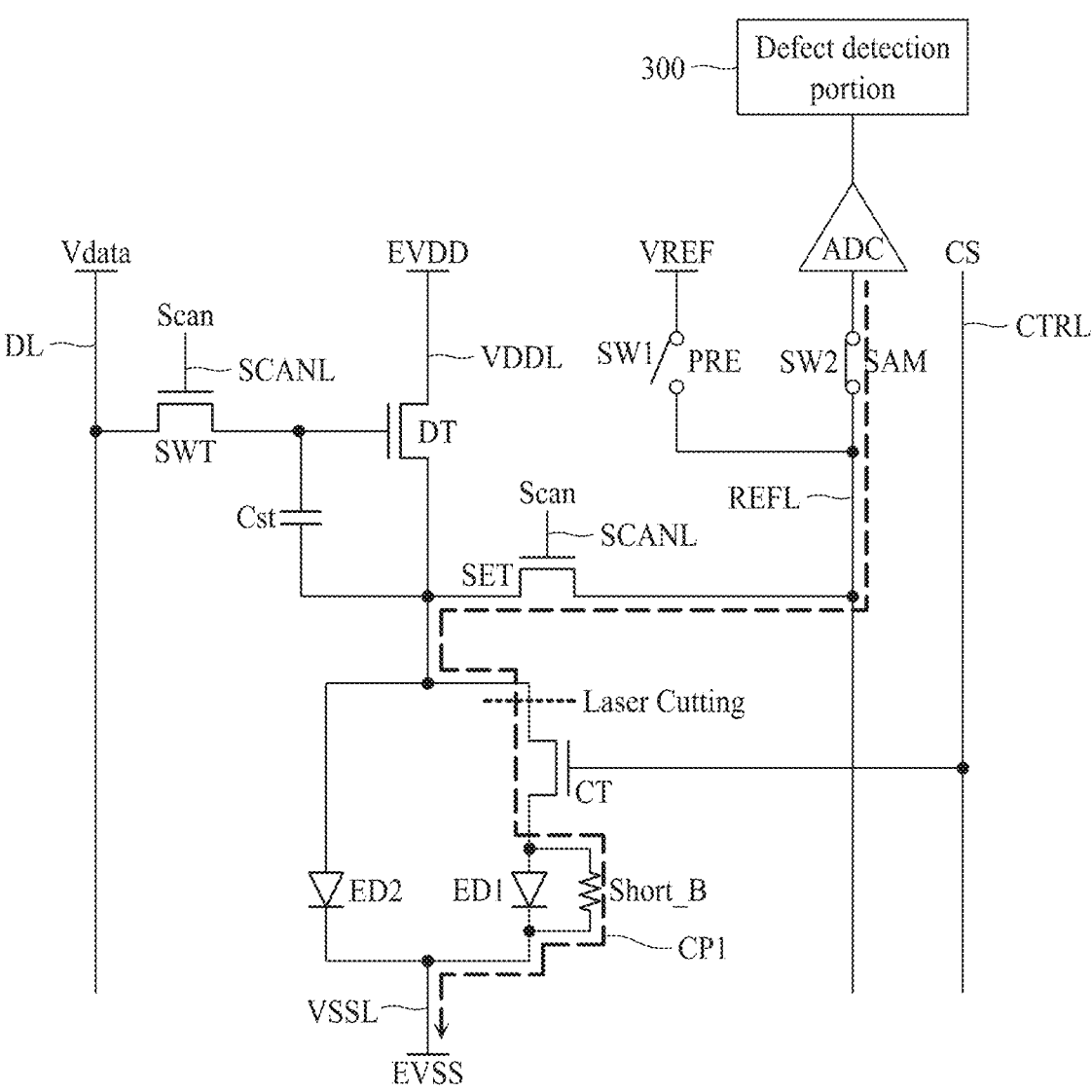
FIG. 14 describes an example operation of a subpixel during a discharge period when a defect occurs in a first light emitting element.
Figure 15:
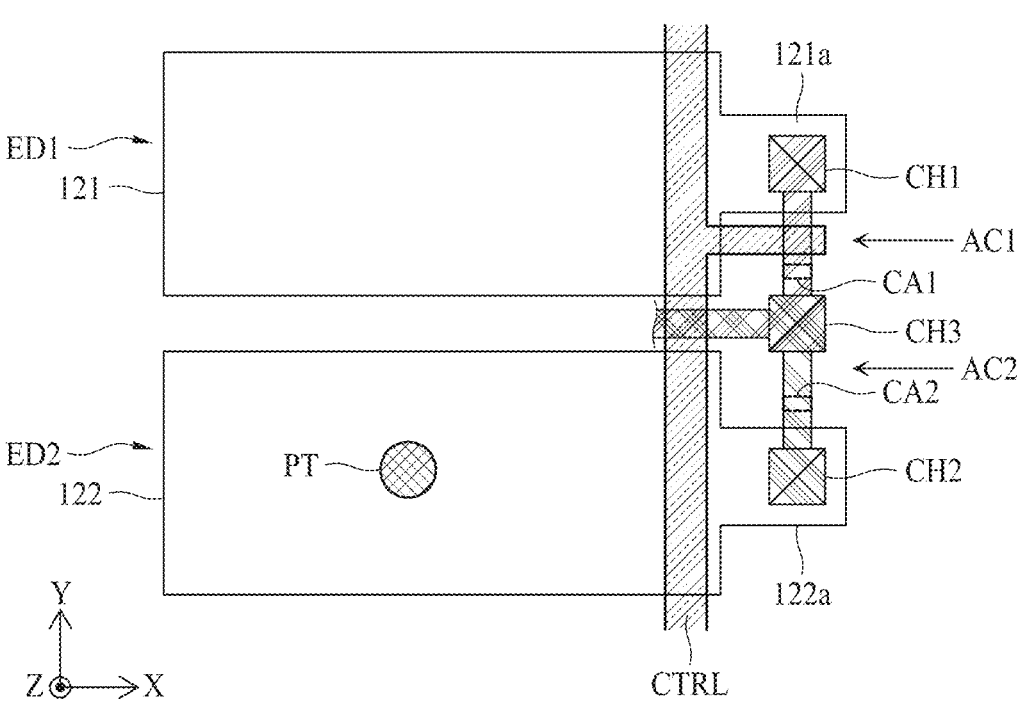
FIG. 15 illustrates an example in which a defect occurs in a second light emitting element.
Figure 16:
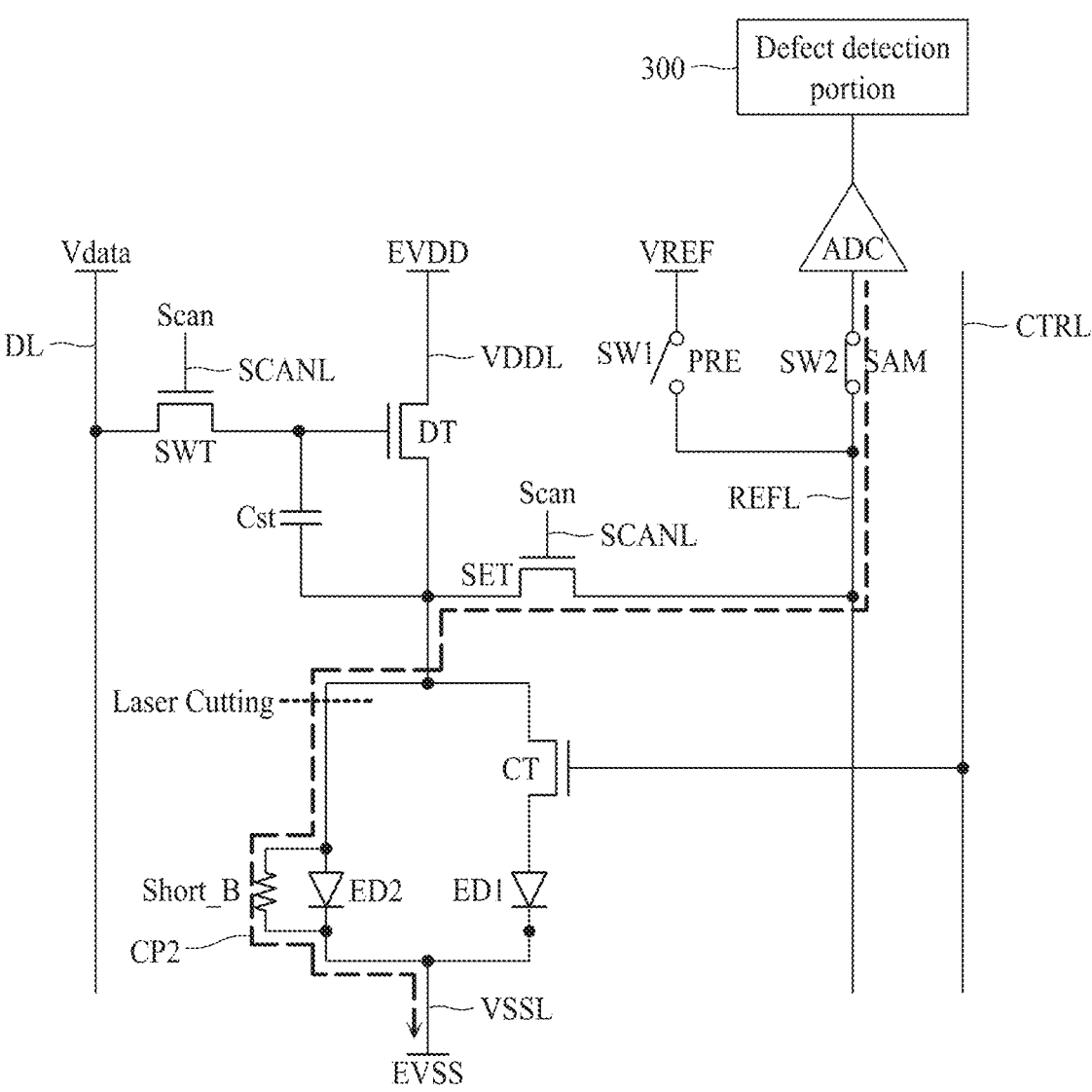
FIG. 16 describes an example operation of a subpixel during a discharge period when a defect occurs in a second light emitting element.
Figure 17:
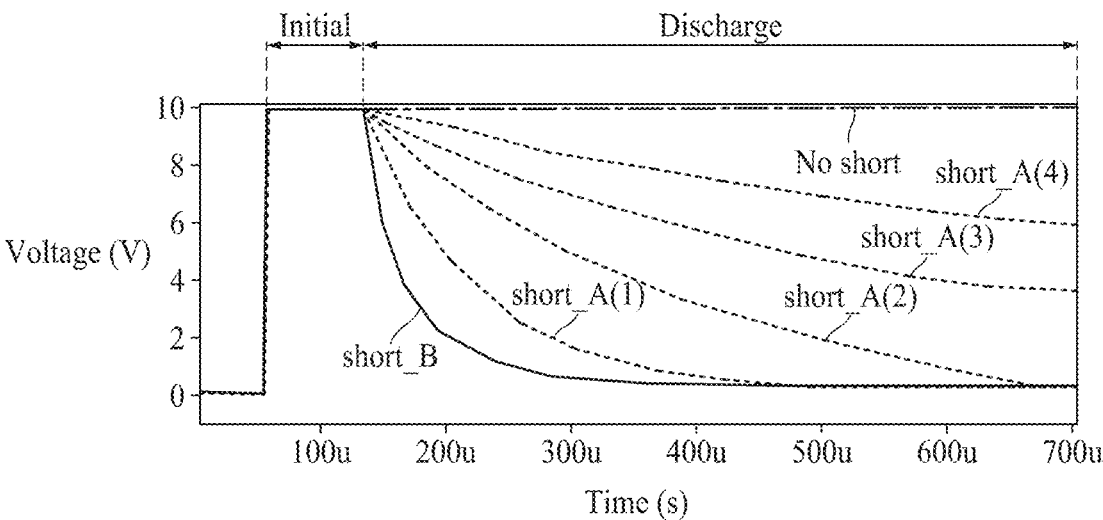
FIG. 17 is a graph illustrating a change in a sensing voltage when a defect occurs in a first light emitting element and a defect occurs in a second light emitting element.

FIG. 11 illustrates a driving waveform in the defect inspection period, and FIG. 12 describes an operation of the subpixel during an initialization period. FIG. 13 illustrates an example in which a defect occurs in the first light emitting element, FIG. 14 describes an operation of the subpixel during a discharge period when a defect occurs in the first light emitting element, FIG. 15 illustrates an example in which a defect occurs in the second light emitting element, and FIG. 16 describes an operation of the subpixel during a discharge period when a defect occurs in the second light emitting element. FIG. 17 is a graph illustrating a change in a sensing voltage when a defect occurs in the first light emitting element and a defect occurs in the second light emitting element.

As described with reference to FIGS. 3 to 10, the display panel 110 according to an embodiment of the present disclosure may connect each of the divided anode electrodes 121 and 122 to different resistors and may determine a short occurrence position through electrical sensing. Specifically, the display panel 110 according to an embodiment of the present disclosure may be formed such that the first anode connection portion AC1 connected to the first anode electrode 121 and the second anode connection portion AC2 connected to the second anode electrode 122 have different resistances. For example, the first anode connection portion AC1 may include the control transistor CT and may have a resistance higher than that of the second anode connection portion AC2.

The display panel 110 according to an embodiment of the present disclosure may determine a position of the electrode where a short occurs by using a resistance difference between the first anode connection portion AC1 and the second anode connection portion AC2. The display panel 110 according to an embodiment of the present disclosure may perform a defect inspection for detecting a defective subpixel before a product shipment. As shown in FIG. 11, the defect inspection period may include the initialization period and the discharge period.

First, the scan signal Scan may be activated by the gate-on voltage during the initialization period and the discharge period. For example, the gate-on voltage of the scan signal Scan may be at a high level.

The switching transistor SWT and the sensing transistor SET may be turned-on in response to the scan signal Scan. The switching transistor SWT may connect the data line DL to the first electrode of the capacitor Cst in response to the gate-on voltage of the scan signal Scan. The switching transistor SWT may supply the data voltage Vdata supplied through the data line DL to the first electrode of the capacitor Cst. In this case, a voltage corresponding to a black voltage may be supplied as the data voltage Vdata. For example, 0V may be supplied to the data voltage Vdata.

The sensing transistor SET may connect the reference line REFL to the second electrode of the capacitor Cst in response to the gate-on voltage of the scan signal Scan. When the initialization voltage Vref (or reference voltage) is applied to the reference line REFL, the sensing transistor SET may supply the reference voltage Vref (or initialization voltage) supplied through the reference line REFL to the second electrode of the capacitor Cst.

The reference line REFL may be connected to the reference voltage source VREF or the analog-to-digital AD converter ADC according to the control signal. The first switch SW1 may connect or disconnect the reference voltage source VREF from the reference line REFL according to the initialization control signal PRE.

During the initialization period, the initialization control signal PRE may be activated by the turn-on voltage. For example, the turn-on voltage of the initialization control signal PRE may be a high level. As shown in FIG. 12, when the first switch SW1 is turned-on according to the initialization control signal PRE of the turn-on level, the reference line REFL may be connected to the reference voltage source VREF and initialized to the reference voltage Vref (or initialization voltage, or Ref Sensing Voltage). The reference line REFL may be connected to the reference voltage source VREF during the initialization period and may be charged with the voltage applied from the reference voltage source VREF (Ref Sensing Voltage).

When the sensing transistor SET is turned-on, the reference voltage Vref (or initialization voltage) applied through the reference line REFL may be transferred to the second electrode of the capacitor Cst. In addition, the reference voltage Vref (or initialization voltage) may also be applied to the source electrode of the driving transistor DT.

During the discharge period, the initialization control signal PRE may be deactivated by a turn-off voltage. For example, the turn-off voltage of the initialization control signal PRE may be a low level. When the first switch SW1 is turned-off according to the initialization control signal PRE of the turn-off level, the reference line REFL may be separated from the reference voltage source VREF. The reference line REFL may be separated from the reference voltage source VREF during the discharge period to discharge at least a portion of the reference voltage Vref (or initialization voltage).

The second switch SW2 may connect or disconnect the AD converter ADC and the reference line REFL according to the sampling control signal SAM. The sampling control signal SAM may be activated by the turn-on voltage in the discharge period. For example, the turn-on voltage of the sampling control signal SAM may be a high level. As shown in FIG. 11, the sampling control signal SAM may be activated by the turn-on voltage at least once in the discharge period. When the second switch SW2 is turned-on in response to the sampling control signal SAM of the turn-on level, the reference line REFL may be connected to the AD converter ADC. In this case, the AD converter ADC may be connected to the reference line REFL to sense the voltage charged in the reference line REFL.

In addition, when the second switch SW2 is turned-off according to the sampling control signal SAM of the turn-off level, the reference line REFL may be separated from the AD converter ADC.

The display panel 110 according to an embodiment of the present disclosure may further include a defect detection portion 300 to determine the element in which a defect occurs based on the voltage sensed by the AD converter ADC. The AD converter ADC may convert the sensed voltage into digital sensing data and may output the digital sensing data to the defect detection portion 300. In this case, the defect detection portion 300 may be a component included in an external circuit board (not shown) or may be a component included in an external defect inspection device.

The defect detection portion 300 may determine the element in which a defect occurs based on the sensing voltage. In detail, the reference line REFL may be connected to the reference voltage source VREF during the initialization period and may be charged with the voltage (reference voltage or initialization voltage). In addition, the reference line REFL may be separated from the reference voltage source VREF during the discharge period. The scan signal Scan is activated by the gate-on voltage during the discharge period, whereby the first light emitting element ED1 and the second light emitting element ED2 together with the switching transistor SWT, the sensing transistor SET, and the driving transistor DT may also be connected to the reference line REFL.

When the first light emitting element ED1 and the second light emitting element ED2 are normal elements (No short), the internal resistance of each of the first light emitting element ED and the second light emitting element ED2 is very large, and thus, the current passing through the first light emitting element ED1 and the second light emitting element ED2 may be very small. Accordingly, as shown in FIG. 17, the voltage (reference voltage or initialization voltage) charged in the reference line REFL may be maintained without being discharged or may be discharged at a very slow speed.

When the voltage sensed through the AD converter ADC is close to the voltage (reference voltage or initialization voltage), the defect detection portion 300 may determine that both the first light emitting element ED1 and the second light emitting element ED2 included in the corresponding subpixel are normal elements.

On the other hand, a defect short_A may occur in the first light emitting element ED1 of the first light emitting element ED1 and the second light emitting element ED2. As shown in FIG. 13, when foreign substance PT may be generated on the first anode electrode 121 of the first light emitting element ED1, and the first anode electrode 121 of the first light emitting element ED1 and the cathode electrode 140 are in contact with each other, a short circuit may occur. Accordingly, a current path CP1 in which the first anode electrode 121 and the cathode electrode 140 of the first light emitting element ED1 are directly connected to each other without passing through the emission layer 130 of the first light emitting element ED1 may occur, as shown in FIG. 14. The resistance in the area where the first anode electrode 121 and the cathode electrode 140 of the first light emitting element ED1 are shorted is much smaller than the internal resistance of the first light emitting element ED1, whereby a large amount of current may flow. Accordingly, as shown in FIG. 17, when the defect short_A occurs in the first light emitting element ED1, the voltage (reference voltage or initialization voltage) charged in the reference line REFL may be discharged at a faster speed as compared to that when the first and second light emitting elements ED1 and ED2 are normal.

In addition, a defect short_B may occur in the second light emitting element ED2 of the first light emitting element ED1 and the second light emitting element ED2. As shown in FIG. 15, when foreign substance PT may be generated on the second anode electrode 122 of the second light emitting element ED2, and the second anode electrode 122 of the second light emitting element ED2 and the cathode electrode 140 are in contact with each other, a short circuit may occur. Accordingly, a current path CP2 in which the second anode electrode 122 and the cathode electrode 140 of the second light emitting element ED2 are directly connected to each other without passing through the emission layer 130 of the second light emitting element ED2 may occur, as shown in FIG. 16. The resistance in the area where the second anode electrode 122 and the cathode electrode 140 of the second light emitting element ED2 are shorted is much smaller than the internal resistance of the second light emitting element ED2, whereby a large amount of current may flow. Accordingly, as shown in FIG. 17, when the defect short_B occurs in the second light emitting element ED2, the voltage (reference voltage or initialization voltage) charged in the reference line REFL may be discharged at a faster speed as compared to that when the first and second light emitting elements ED1 and ED2 are normal.

The defect detection portion 300 may determine that one of the first light emitting element ED1 and the second light emitting element ED2 included in the corresponding subpixel is the defective element when the voltage sensed through the AD converter ADC is smaller than a reference value.

In addition, the display panel 110 according to an embodiment of the present disclosure may determine a defect occurrence position in the first light emitting element ED1 and the second light emitting element ED2 by using the resistance difference between the first anode connection portion AC1 and the second anode connection portion AC2. In the display panel 110 according to an embodiment of the present disclosure, the first anode connection portion AC1 connected to the first anode electrode 121 may have a higher resistance than the second anode connection portion AC2 connected to the second anode electrode 122.

When the defect short_A occurs in the first light emitting element ED1, the first anode connection portion AC1 having a relatively high resistance may be provided on the current path CP1. The first anode connection portion AC1 may include the control transistor CT. The control transistor CT may be at least partially turned-off by the control signal applied through the control line CTRL during the defect inspection period. The control transistor CT in the turn-off state may have a higher resistance as compared to that of the control transistor CT in the turn-on state.

When the defect short_A occurs in the first light emitting element ED1, a relatively high resistance is provided on the current path CP1, whereby a discharge speed may be slow compared to that when the defect short_B occurs in the second light emitting element ED2, as shown in FIG. 17. Accordingly, when the defect short_A occurs in the first light emitting element ED1, the voltage sensed through the AD converter ADC may be high compared to that when the defect short_B occurs in the second light emitting element ED2.

When the voltage sensed through the AD converter ADC is smaller than a first reference value, the defect detection portion 300 may determine the second light emitting element ED2 as the defective element. The display panel 110 according to an embodiment of the present disclosure may include a second cutting area CA2 in the second anode connection portion AC2 configured to connect the second anode electrode 122 and the driving transistor DT. The second cutting area CA2 may be provided in a portion of the second anode connection portion AC2 which does not overlap the first anode connection portion AC1. In the display panel 110 according to an embodiment of the present disclosure, when the second light emitting element ED2 is determined as the defective element, the second cutting area CA2 of the second anode connection portion AC2 may be cut by laser, thereby electrically separating the second light emitting element ED2 in which a defect occurs from the driving transistor DT. Accordingly, the first light emitting element ED1 of the corresponding subpixel may be normally operated.

In addition, the defect detection portion 300 may determine the first light emitting element ED1 to be a defective element when the voltage sensed through the AD converter ADC is equal to or greater than the first reference value and is smaller than a second reference value greater than the first reference value. In the display panel 110 according to an embodiment of the present disclosure, a first cutting area CA1 may be provided in the first anode connection portion AC1 for connecting the first anode electrode 121 and the driving transistor DT.

The first cutting area CA1 may be provided in a portion of the first anode connection portion AC1 which does not overlap the second anode connection portion AC2. The first anode connection portion AC1 may be provided with the first cutting area CA1 in a portion of the area where the active layer ACT2 of the control transistor CT is formed. The first cutting area CA1 may be provided in a portion which does not overlap the gate electrode GE2, the source electrode SE2, and the drain electrode DE2 in the area where the active layer ACT2 of the control transistor CT is formed.

When the first light emitting element ED1 is determined as a defective element, the display panel 110 according to an embodiment of the present disclosure may electrically separate the first light emitting element ED1 which a defect occurs and the driving transistor DT from each other by laser cutting the first cutting area CA1 of the first anode connection portion AC1. Accordingly, the second light emitting element ED2 of the corresponding subpixel may be normally operated.

The display panel 110 according to an embodiment of the present disclosure may accurately detect the position of the defective light emitting device by using the resistance difference between the first anode connection portion AC1 and the second anode connection portion AC2.

Also, the display panel 110 according to an embodiment of the present disclosure may adjust the voltage of the control signal applied to the control transistor CT of the first anode connection portion AC1 so that it is possible to improve a detection for a fine short circuit. The defect inspection period may include a plurality of sensing periods, and each of the plurality of sensing periods may include the initialization period and the discharge period. For example, the defect inspection period may include a first sensing period and a second sensing period.

The control transistor CT of the first anode connection portion AC1 may be applied with the first gate-off voltage through the control line CTRL during the first sensing period of the defect inspection period and may be applied with the second gate-off voltage during the second sensing period of the defect inspection period. The first gate-off voltage and the second gate-off voltage may have different voltages.

When the defect short_A occurs in the first light emitting element ED1, the resistance of the second control transistor CT may vary in the first sensing period and the second sensing period. Accordingly, a speed at which at least a portion of the reference voltage Vref (or initialization voltage) is discharged from the reference line REFL during the discharge period of the first sensing period (See short_A(1) of FIG. 17) may be different from a speed at which at least a portion of the reference voltage Vref (or initialization voltage) is discharged from the reference line REFL during the discharge period of the second sensing period (See short_A(2) of FIG. 17).

The display panel 110 according to an embodiment of the present disclosure may include two or more sensing periods within the defect inspection period. The display panel 110 according to an embodiment of the present disclosure may perform the defect inspection while gradually increasing or decreasing the voltage of the control signal applied to the control transistor CT. For example, the defect inspection period may include first to fourth sensing periods. The display panel 110 may perform the defect inspection while gradually increasing or decreasing the voltage of the control signal applied to the control transistor CT in each of the first to fourth sensing periods. In each of the first sensing period (See short_A(1) of FIG. 17), the second sensing period (See short_A(2) of FIG. 17), the third sensing period (See short_A(3) of FIG. 17), and the fourth sensing period (See short_A(4) of FIG. 17), a speed at which at least a portion of the reference voltage Vref (or initialization voltage) is discharged from the reference line REFL may gradually increase or decrease during the discharge period.

As described above, in the display panel 110 according to an embodiment of the present disclosure, even when a fine short circuit occurs in the first light emitting element ED1, the defect of the first light emitting element ED1 may be accurately detected while adjusting the voltage of the control signal applied to the control transistor CT. Accordingly, the display panel 110 according to an embodiment of the present disclosure may improve the detection for the defect.

Furthermore, the display panel 110 according to an embodiment of the present disclosure may reduce a product defect rate through a repair process. In the display panel 110 according to an embodiment of the present disclosure, as the product defect rate decreases, manufacturing process costs may be reduced, manufacturing process time may be shortened, and production energy may be reduced. In addition, the display panel 110 according to the present disclosure may reduce the generation of greenhouse gas which may occur due to the manufacturing process, thereby implementing ESG (Environment/Social/Governance).

In addition, the display panel 110 according to an embodiment of the present disclosure may sense the voltage through the reference line REFL without using a separate sensing line. When the display panel 110 is a transparent display panel, transmittance may be improved compared to a structure using a separate sensing line.

In the present disclosure, the position of the defective light emitting element may be accurately detected by using the resistance difference between the first anode connection line and the second anode connection line connected to the divided anode electrodes so that it is possible to reduce a product defect rate through a repair process.

In addition, in the present disclosure, as the product defect rate decreases, manufacturing process cost may be reduced, manufacturing process time may be shortened, and production energy may be reduced. In addition, the present disclosure may reduce the generation of greenhouse gas which may occur due to the manufacturing process, thereby implementing ESG (Environment/Social/Governance).

Although the embodiments of the present disclosure have been described in more detail with reference to the accompanying drawings, the present disclosure is not necessarily limited to this embodiment and may be variously modified without departing from the spirit of the present disclosure. Therefore, the embodiments disclosed herein are intended to illustrate the scope of the technical idea of the present disclosure, and the scope of the technical idea of the present disclosure is not limited by the embodiments. Therefore, it should be understood that the embodiments described above are exemplary and not limiting in all respects.

What is claimed is:

1. A display device comprising:
   a driving transistor on a substrate, the driving transistor including an active layer, a gate electrode, a source electrode, and a drain electrode;
   a light emitting element on the driving transistor, the light emitting element including an anode electrode having a first anode electrode and a second anode electrode that is spaced apart from the first anode electrode, an emission layer, and a cathode electrode;
   a first anode connection portion configured to electrically connect the first anode electrode and the driving transistor to each other;
   a second anode connection portion configured to electrically connect the second anode electrode and the driving transistor to each other; and
   a third anode connection portion having one end that is electrically connected to one of the source electrode and the drain electrode of the driving transistor and extends in an outer direction,
   wherein the first anode connection portion includes a control transistor having an active layer, a gate electrode, a source electrode, and a drain electrode, and
   wherein one of the source electrode and the drain electrode of the control transistor is connected to the third anode connection portion through a contact hole.

2. The display device according to claim 1, wherein one of the source electrode and the drain electrode of the control transistor is connected to the driving transistor, and the other thereof is connected to the first anode electrode.

3. The display device according to claim 1, further comprising:
   a control line applied with a control signal for the control transistor, wherein the gate electrode of the control transistor is connected to the control line.

4. The display device according to claim 3, wherein the control line extends in a first direction between the driving transistor and the first anode connection portion.

5. The display device according to claim 1, wherein the second anode connection portion includes a first anode connection line that is on the driving transistor.

6. The display device according to claim 1, wherein the third anode connection portion includes a second anode connection line that is on the driving transistor.

7. The display device according to claim 1, wherein one end of the second anode connection portion is electrically connected to the third anode connection portion and another end of the second anode connection portion is electrically connected to the second anode electrode.

8. The display device according to claim 1, wherein the second anode connection portion extends from the third anode connection portion.

9. The display device according to claim 1, wherein the first anode connection portion includes a first cutting area that is configured to be cut when a defect occurs in the first anode electrode, and the second anode connection portion includes a second cutting area that is configured to be cut when a defect occurs in the second anode electrode.

10. The display device according to claim 9, wherein the first cutting area is at a portion that is non-overlapping with the gate electrode, the source electrode, and the drain electrode of the control transistor in an area that includes the active layer of the control transistor.

11. The display device according to claim 1, wherein the first anode connection portion includes a first cutting area through which the first anode electrode and the driving transistor are disconnected, or
   the second anode connection portion includes a second cutting area through which the second anode electrode and the driving transistor are disconnected.

12. The display device according to claim 1, wherein the light emitting element includes a first light emitting element including the first anode electrode, the emission layer, and the cathode electrode, and a second light emitting element including the second anode electrode, the emission layer, and the cathode electrode, and
   wherein the first light emitting element and the second light emitting element share the driving transistor.

13. The display device according to claim 12, further comprising:
   a reference line electrically connected to the first light emitting element and the second light emitting element, the reference line applied with an initialization voltage during a first period; and
   an analog-to-digital converter connected to the reference line, the analog-to-digital converter configured to sense a voltage through the reference line during a second period.

14. The display device according to claim 13, wherein during both the first period and the second period, a voltage corresponding to a black voltage is applied to the gate electrode of the driving transistor.

15. The display device according to claim 13, further comprising:
   a first switch configured to connect the reference line to a reference voltage source during the first period and to separate the reference line from the reference voltage source during the second period; and
   a second switch configured to connect the reference line to the analog-to-digital converter during at least a portion of the second period and to separate the reference line from the analog-to-digital converter during the first period.

16. The display device according to claim 13, further comprising a defect detection portion configured to determine a defective light emitting element among the first light emitting element and the second light emitting element based on the voltage sensed through the analog-to-digital converter.

17. The display device according to claim 16, wherein the defect detection portion determines the second light emitting element as a defective light emitting element responsive to the sensed voltage being less than a first reference value, and determines the first light emitting element as a defective light emitting element responsive to the sensed voltage being equal to or greater than the first reference value and less than a second reference value that is greater than the first reference value.

18. The display device according to claim 13, wherein a defective light emitting element among the first light emitting element and the second light emitting element is determined based on the voltage sensed through the AD converter.

19. The display device according to claim 1, wherein a resistance of the first anode connection portion is greater than a resistance of the second anode connection portion.

20. The display device according to claim 1,
wherein the first anode electrode includes a first protrusion protruding outward from one side thereof,
the second anode electrode includes a second protrusion protruding outward from one side thereof, and the first anode connection portion and the second anode connection portion are disposed between the first protrusion and the second protrusion.

21. A display device comprising:
a driving transistor provided on a substrate and including a gate electrode, a source electrode, and a drain electrode;
a light emitting element provided on the driving transistor and including an anode electrode having a first anode electrode and a second anode electrode spaced apart from each other, an emission layer, and a cathode electrode;
a first anode connection portion configured to electrically connect the first anode electrode and the driving transistor to each other;
a second anode connection portion configured to electrically connect the second anode electrode and the driving transistor to each other;
a third anode connection portion having one end that is electrically connected to one of the source electrode and the drain electrode of the driving transistor and extends in an outer direction,
wherein the first anode connection portion includes a variable resistance portion connected between the first anode electrode and the driving transistor, and
wherein one of the source electrode and the drain electrode of the control transistor is connected to the third anode connection portion through a contact hole.

22. The display device according to claim 21, wherein a resistance of the variable resistance portion is controlled by a control signal supplied from a control line.

* * * * *